(12) United States Patent
Nishida

(10) Patent No.: US 8,835,235 B2
(45) Date of Patent: Sep. 16, 2014

(54) THIN-FILM SEMICONDUCTOR DEVICE AND METHOD FOR FABRICATING THIN-FILM SEMICONDUCTOR DEVICE

(71) Applicant: Panasonic Corporation, Osaka (JP)

(72) Inventor: Kenichirou Nishida, Hyogo (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 13/772,730

(22) Filed: Feb. 21, 2013

(65) Prior Publication Data

US 2013/0161630 A1 Jun. 27, 2013

Related U.S. Application Data

(63) Continuation of application No. PCT/JP2011/002588, filed on May 10, 2011.

(51) Int. Cl.
| | | |
|---|---|---|
| *H01L 21/84* | (2006.01) | |
| *H01L 29/10* | (2006.01) | |
| *H01L 29/66* | (2006.01) | |
| *H01L 29/786* | (2006.01) | |
| *H01L 21/268* | (2006.01) | |
| *H01L 29/49* | (2006.01) | |
| *H01L 21/28* | (2006.01) | |

(52) U.S. Cl.
CPC ...... *H01L 29/6675* (2013.01); *H01L 29/66765* (2013.01); *H01L 29/78603* (2013.01); *H01L 21/268* (2013.01); *H01L 29/4908* (2013.01); *H01L 21/28008* (2013.01); *H01L 29/78672* (2013.01)
USPC ........................................... 438/158; 257/66

(58) Field of Classification Search
USPC ...................... 438/158; 257/66, 67
See application file for complete search history.

(56) References Cited

U.S. PATENT DOCUMENTS

| 5,132,745 A | 7/1992 | Kwasnick et al. |
| 6,187,616 B1 | 2/2001 | Gyoda |

(Continued)

FOREIGN PATENT DOCUMENTS

| JP | 61-044468 | 3/1986 |
| JP | 62-252166 | 11/1987 |

(Continued)

OTHER PUBLICATIONS

U.S. Appl. No. 13/679,313 to Kenichirou Nishida et al., filed Nov. 16, 2012.

(Continued)

*Primary Examiner* — Fernando L Toledo
*Assistant Examiner* — Neil Prasad
(74) *Attorney, Agent, or Firm* — Greenblum & Bernstein, P.L.C.

(57) ABSTRACT

A method for fabricating a thin-film semiconductor device according to the present disclosure includes: preparing a glass substrate; forming, above the glass substrate, an undercoat layer including a nitride film; forming a barrier layer above the undercoat layer; forming a molybdenum metal layer above the barrier layer; forming a gate electrode from the molybdenum metal layer; forming a gate insulating film above the gate electrode; forming a non-crystalline silicon layer as a non-crystalline semiconductor layer above the gate insulating film; forming a polycrystalline semiconductor layer including a polysilicon layer by annealing the non-crystalline silicon layer using a continuous-wave (CW) laser, the non-crystalline silicon layer being crystallized by the annealing; and forming a source electrode and a drain electrode above the polysilicon layer. Part of the barrier layer changes into a layer including oxygen atoms as a major component by the annealing when forming the polysilicon layer.

28 Claims, 18 Drawing Sheets

(56) References Cited

U.S. PATENT DOCUMENTS

| | | | |
|---|---|---|---|
| 6,420,232 B1 * | 7/2002 | Wu | 438/257 |
| 6,844,523 B2 | 1/2005 | Yamazaki et al. | |
| 7,867,907 B2 | 1/2011 | Shimomura et al. | |
| 8,003,449 B2 | 8/2011 | Akimoto et al. | |
| 2003/0080100 A1 | 5/2003 | Yamazaki et al. | |
| 2006/0292726 A1 | 12/2006 | Akimoto et al. | |
| 2008/0087629 A1 | 4/2008 | Shimomura et al. | |
| 2011/0272699 A1 | 11/2011 | Akimoto et al. | |

FOREIGN PATENT DOCUMENTS

| | | |
|---|---|---|
| JP | 04-037035 | 2/1992 |
| JP | 04-505831 | 10/1992 |
| JP | 06-045607 | 2/1994 |
| JP | 09-293870 | 11/1997 |
| JP | 2000-091584 | 3/2000 |
| JP | 2002-229065 | 8/2002 |
| JP | 2003-158076 | 5/2003 |
| JP | 2006-179878 | 7/2006 |
| JP | 2008-147626 | 6/2008 |
| WO | 92/06504 | 4/1992 |
| WO | 99/41777 | 8/1999 |

OTHER PUBLICATIONS

U.S. Appl. No. 13/632,607 to Yuji Kishida et al., filed Oct. 1, 2012.
U.S. Appl. No. 13/681,867 to Arinobu Kanegae, filed Nov. 20, 2012.
U.S. Appl. No. 13/686,043 to Arinobu Kanegae, filed Nov. 27, 2012.
U.S. Appl. No. 13/710,969 to Arinobu Kanegae et al., filed Dec. 11, 2012.
U.S. Appl. No. 13/737,275 to Arinobu Kanegae et al., filed Jan. 9, 2013.
U.S. Appl. No. 13/742,481 to Arinobu Kanegae et al., filed Jan. 16, 2013.
International Search Report in PCT/JP2011/002588, dated Aug. 2, 2011.

* cited by examiner

CW laser

Laser oscillation state

Excimer laser (pulse)

400 μm

Laser oscillation state

Energy J 30 ns

Time t

FIG. 10

| Barrier layer material | Oxide | Crystalline structure | Number of atoms in one lattice | Lattice constant (Å) | Filling degree | Number of atoms in 1 cm² × 10 nm (atoms) | Thickness necessary for reaction with all of oxygen atoms (nm) |
|---|---|---|---|---|---|---|---|
| Sn | SnO | Diamond | 8 | 6.49 | 30% | 8.780E + 17 | 5.68 |
| Fe | FeO | Body-centered cubic lattice | 2 | 2.87 | 30% | 2.538E + 18 | 1.97 |
| W | WO$_2$ | Body-centered cubic lattice | 2 | 3.16 | 30% | 1.901E + 18 | 1.31 |
| Nb | Nb$_2$O$_5$ | Body-centered cubic lattice | 2 | 3.29 | 30% | 1.685E + 18 | 1.19 |
| Cr | Cr$_2$O$_3$ | Body-centered cubic lattice | 2 | 2.88 | 30% | 2.512E + 18 | 1.33 |
| Mn | MnO | Cubic crystal system | 29 | 8.9 | 30% | 1.234E + 18 | 4.05 |
| Ta | Ta$_2$O$_5$ | Body-centered cubic lattice | 2 | 3.3 | 30% | 1.670E + 18 | 1.20 |
| V | V$_2$O$_3$ | Body-centered cubic lattice | 2 | 3.03 | 30% | 2.157E + 18 | 1.55 |
| Si | SiO$_2$ | Diamond | 8 | 5.43 | 30% | 1.499E + 18 | 1.67 |
| Ce | CeO$_2$ | Face-centered cubic lattice | 4 | 5.16 | 30% | 8.734E + 17 | 2.86 |
| Ti | TiO | Close-packed hexagonal lattice | 2 | a=2.95 c=4.96 | 30% | 1.390E + 18 | 3.60 |

THIN-FILM SEMICONDUCTOR DEVICE AND METHOD FOR FABRICATING THIN-FILM SEMICONDUCTOR DEVICE

CROSS REFERENCE TO RELATED APPLICATION

This is a continuation application of PCT Patent Application No. PCT/JP2011/002588 filed on May 10, 2011, designating the United States of America. The entire disclosure of the above-identified application, including the specification, drawings and claims is incorporated herein by reference in their entirety.

TECHNICAL FIELD

One or more exemplary embodiments disclosed herein relate generally to thin-film semiconductor devices for display for driving active matrix liquid crystal displays or organic EL displays and methods for fabricating the thin-film semiconductor devices, and particularly to a thin-film semiconductor device for display using a polysilicon layer as a channel layer and a method for fabricating the thin-film semiconductor device for display.

BACKGROUND ART

Conventionally, in active-matrix flat-panel displays (FPD) such as liquid crystal displays or organic EL displays, thin-film semiconductor devices for display (hereafter simply referred to as "thin-film semiconductor devices") also referred to as thin-film transistors (TFT) have been used for driving pixels.

Among the displays, the organic EL displays are current-driven devices unlike voltage-driven liquid crystal displays. Accordingly, there is an urgent need for developing a thin-film semiconductor device having excellent on-off characteristics as a driving circuit in an active matrix display device.

Conventionally, as a thin-film semiconductor device for the driving circuit in the liquid crystal display, a thin-film semiconductor device using a single-layer non-crystalline semiconductor layer (amorphous semiconductor layer) such as amorphous silicon as a channel layer has been used. This type of thin-film semiconductor device has a large band gap, and thus the off-state current is low. However, there is a problem that the on-state current is low as well due to low mobility.

There is another thin-film semiconductor device for the driving circuit in the liquid crystal display, in which a single-layer polycrystalline semiconductor layer has been used as the channel layer. This type of thin-film semiconductor device has high mobility of carriers and thus has a large on-state current, contrary to the thin-film semiconductor device using the single-layer non-crystalline semiconductor layer as the channel layer. However, there is a problem that the off-state current is also high due to the high carrier mobility.

In view of these problems, in the driving circuit of the organic EL display, a thin-film semiconductor device which has a two-layered structure including a first channel layer made of polycrystalline semiconductor layer and a second channel layer made of a non-crystalline semiconductor layer has been developed.

The patent literature 1 discloses a method for forming the polycrystalline semiconductor layer. The method for forming the polycrystalline semiconductor layer disclosed in the patent literature 1 features crystallizing an amorphous silicon film by annealing a substrate on which the amorphous silicon film is formed at a temperature in a range from 800° C. to 1000° C.

CITATION LIST

Patent Literature

[Patent Literature 1] WO1999/041777

SUMMARY

Technical Problem

There is a problem in the conventional thin-film semiconductor device that molybdenum used as a gate electrode causes flake-offs on the gate electrode.

The present disclosure has been conceived in view of the problem, and one non-limiting and exemplary embodiment provides a thin-film semiconductor device capable of inhibiting generation of flake-offs on the gate electrode even if molybdenum is used as the gate electrode and a method for fabricating the thin-film semiconductor device for display.

Solution to Problem

In one general aspect, the method for fabricating the thin-film semiconductor device disclosed here feature: preparing a glass substrate; forming, above the glass substrate, an undercoat layer for inhibiting diffusion of an impurity in the glass substrate, the undercoat layer including a nitride film; forming a barrier layer above the undercoat layer; forming a metal layer including molybdenum above the barrier layer; forming a gate electrode from the metal layer by an etching process; forming a gate insulating film above the gate electrode; forming a non-crystalline silicon layer above the gate insulating film; forming a polysilicon layer by annealing the non-crystalline silicon layer at a temperature higher than or equal to a melting temperature of the non-crystalline silicon layer for at least 0.1 μsec using a continuous-wave (CW) laser, the non-crystalline silicon layer being crystallized by the annealing; and forming a source electrode and a drain electrode above the polysilicon layer, in which the barrier layer includes (i) an element having a force for bonding with an oxygen atom greater than that of the molybdenum or (ii) a compound of the element, and at least part of the barrier layer changes into a layer including oxygen atoms as a major component by the annealing when forming the polysilicon layer.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the thin-film semiconductor device for display and the method for fabricating the thin-film semiconductor device for display according to the present disclosure, it is possible to inhibit the oxidation of molybdenum comprising the gate electrode. Accordingly, it is possible to inhibit the generation of the flake-offs on the gate electrode.

BRIEF DESCRIPTION OF DRAWINGS

These and other advantages and features will become apparent from the following description thereof taken in con

FIG. 10 is a chart illustrating exemplary thicknesses for each material in the barrier layer in the thin-film semiconductor device for display according to the embodiment.

DESCRIPTION OF EMBODIMENTS

As described above, in the conventional method for fabricating the thin-film semiconductor device using the single-layer non-crystalline semiconductor layer as the channel layer, there is no high-temperature process. Accordingly, the maximum processing temperature falls within approximately 350° C. at a maximum.

In contrast, in the method for fabricating the thin-film semiconductor device including the polycrystalline semiconductor layer as the channel layer, a process for crystallizing the amorphous silicon film by annealing is necessary. A high temperature treatment at a temperature in a range higher than or equal to 700° C. is necessary for the annealing.

Figure 19A:
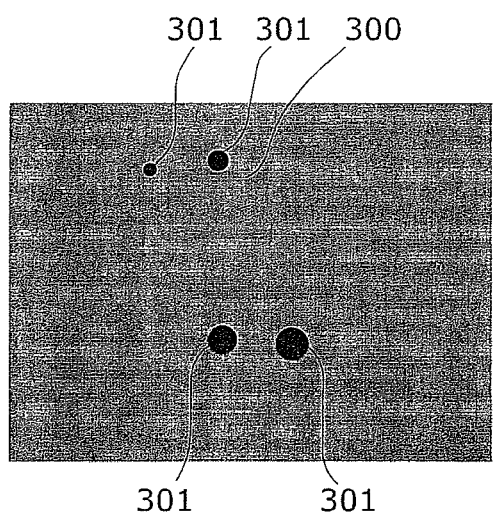
FIG. 19A is a microscopic image of flake-off on the gate electrode captured by an optical microscope in a top view of the thin-film semiconductor device.

According to the results of the experiment conducted by the inventors, in the case where the thin-film semiconductor device including the polysilicon layer as the channel layer was fabricated using molybdenum as the material for the gate electrode, the non-crystalline silicon layer is annealed for crystallization at a temperature in a range from 700° C. to 1400° C. using a continuous wave laser, multiple circular flake-offs in various sizes were generated on the gate electrode, as illustrated in FIG. 19A. FIG. 19A is a microscopic image of the flake-offs on the gate electrode captured by an optical microscope in a top view of the thin-film semiconductor device.

Figure 19B:
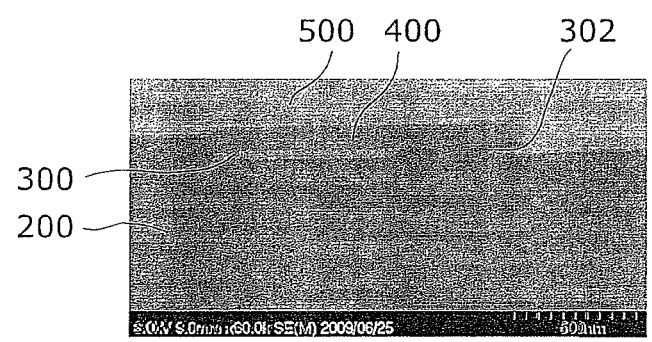
FIG. 19B is a cross-sectional SEM image capturing the flake-off on the gate electrode in a cross-sectional view of the thin-film semiconductor device.

As illustrated in FIG. 19A, multiple circular flake-offs 301 on the gate electrode 300 were observed. FIG. 19B is a cross-sectional SEM image capturing a flake-off around the gate electrode in a cross-sectional view of the thin-film semiconductor device in this case. As illustrated in FIG. 19B, a gap 302 was observed in the gate electrode 300 made of molybdenum tungsten on the undercoat layer 200 which is a silicon nitride film. With this, part of the gate insulating film 400 and the polycrystalline semiconductor layer 500 above the gate electrode 300 flakes off. As described above, in the bottom-gate thin-film semiconductor device, when a high-temperature annealing is performed after the gate electrode is formed, there is a case in which circular flake-off appears on the gate electrode.

If the thin-film semiconductor device having the flake-off is used as a thin-film transistor, even if a predetermined voltage is applied to the gate electrode, the part with the flake-off does not function as the gate electrode. Consequently, the desired characteristics of the thin-film transistor cannot be achieved, and the function of the thin-film transistor is significantly degraded.

In one general aspect, the method for fabricating the thin-film semiconductor device disclosed here feature: preparing a glass substrate; forming, above the glass substrate, an undercoat layer for inhibiting diffusion of an impurity in the glass substrate, the undercoat layer including a nitride film; forming a barrier layer above the undercoat layer; forming a metal layer including molybdenum above the barrier layer; forming a gate electrode from the metal layer by an etching process; forming a gate insulating film above the gate electrode; forming a non-crystalline silicon layer above the gate insulating film; forming a polysilicon layer by annealing the non-crystalline silicon layer at a temperature higher than or equal to a melting temperature of the non-crystalline silicon layer for at least 0.1 μsec using a continuous-wave (CW) laser, the non-crystalline silicon layer being crystallized by the annealing; and forming a source electrode and a drain electrode above the polysilicon layer, in which the barrier layer includes (i) an element having a force for bonding with an oxygen atom greater than that of the molybdenum or (ii) a compound of the element, and at least part of the barrier layer changes into a layer including oxygen atoms as a major component by the annealing when forming the polysilicon layer.

With this, even if the oxygen atoms present on the surface of the undercoat layer are diffused by the annealing, the oxygen atoms are bonded with the barrier layer made of the material having the bonding force with oxygen greater than that of molybdenum, instead of the molybdenum in the gate electrode. Accordingly, the barrier layer stops the diffusion of the oxygen atoms, which inhibits the oxidation of the molybdenum in the gate electrode. Accordingly, even if high-temperature annealing is performed at a temperature higher than or equal to the melting temperature of the amorphous silicon layer for at least 0.1 μsec using the continuous-wave laser, it is possible to inhibit the flake-off on the gate electrode.

In an aspect of the method for fabricating thin-film semiconductor device according to the embodiment, the barrier layer has a thickness of at least 10 nm, for example.

With this, even if all of the oxygen atoms included in the undercoat layer made of the nitride film are diffused to the barrier layer, it is possible that all of the oxygen atoms are bonded with the barrier layer.

In an aspect of the method for fabricating thin-film semiconductor device according to the embodiment, the undercoat layer has a thickness of at least 100 nm, for example.

With this, the undercoat layer can effectively inhibit the diffusion of sodium.

In an aspect of the method for fabricating thin-film semiconductor device according to the embodiment, the undercoat layer has a thickness of at least 400 nm, for example.

With this, it is possible to form a highly reliable undercoat layer without cracks.

In an aspect of the method for fabricating thin-film semiconductor device according to the embodiment, a concentration of oxygen atoms in the undercoat layer is in a range from $1\times10^{18}/cm^3$ to $1\times10^{21}/cm^3$.

With this, oxygen atoms contained in the undercoat layer are diffused to a barrier layer, reducing the concentration of the oxygen atoms contained in the undercoat layer.

In an aspect of the method for fabricating thin-film semiconductor device according to the embodiment, the non-crystalline silicon layer melts at a temperature more than or equal to 1100° C.

With this, it is possible to perform the annealing at high temperature when the melting temperature of the non-crystalline silicon layer is 1100° C.

In an aspect of the method for fabricating thin-film semiconductor device according to the embodiment, when forming the polysilicon layer, oxygen atoms present on a surface of the undercoat layer are likely to be bonded with the element or the compound of the element including the barrier layer, instead of the molybdenum including the gate electrode, and oxidation of the barrier layer is promoted.

With this, the oxygen atoms are bonded with the barrier layer made of the material having the oxygen bonding force greater than that of molybdenum, which promotes the oxidation of the barrier layer.

In an aspect of the method for fabricating thin-film semiconductor device according to the embodiment, the impurity in the glass substrate is sodium or phosphorus, for example.

With this, the undercoat layer inhibits impurity such as sodium or phosphorus contained in the glass substrate from entering the semiconductor layer.

In an aspect of the method for fabricating thin-film semiconductor device according to the embodiment, the glass substrate contains oxygen atoms as a major component, the undercoat layer has a force for bonding with oxygen atoms that is weaker than that of the glass substrate, and the molybdenum has a force for bonding with oxygen atoms that is weaker than that of the glass substrate and stronger than that of the undercoat layer, for example.

With this, the molybdenum is more likely to be oxidized than the undercoat layer. However, it is possible to suppress the oxidation of molybdenum by the barrier layer.

In an aspect of the method for fabricating thin-film semiconductor device according to the embodiment, forming a second non-crystalline silicon layer above the polysilicon layer between forming the polysilicon layer and forming the source electrode and drain electrode, in which the source electrode and the drain electrode are formed above the second non-crystalline silicon layer.

With this, it is possible to form the non-crystalline silicon layer between (i) the polysilicon layer and (ii) the source electrode or the drain electrode.

In an aspect of the method for fabricating thin-film semiconductor device according to the embodiment, the polysilicon layer includes a microcrystalline silicon layer having an average grain size in a range from 20 nm to 200 nm, for example.

Since the polysilicon layer includes the microcrystalline silicon layer having the average grain size in a range from 20 nm to 200 nm, the carrier mobility is higher than an amorphous semiconductor. Accordingly, a thin-film semiconductor device having excellent on-characteristics can be achieved.

In an aspect of the method for fabricating thin-film semiconductor device according to the embodiment, the element having the force for bonding with the oxygen atom greater than that of the molybdenum is a metal, for example.

With this, the barrier layer may be formed of a metal having the bonding force with the oxygen atoms greater than that of molybdenum.

In an aspect of the method for fabricating thin-film semiconductor device according to the embodiment, the metal is any one of Fe, W, Nb, Cr, Mn, Ta, V, and Ti, for example.

With this, the metal having a large bonding force with oxygen as the material is used for the barrier layer. Accordingly, it is possible to promote the oxidation of the barrier layer more than the oxidation of the molybdenum.

In an aspect of the method for fabricating thin-film semiconductor device according to the embodiment, when forming the gate electrode, the etching process is collectively performed on the barrier layer and the metal layer, and the gate electrode includes the barrier layer and the metal layer, for example.

With this, it is possible to form the barrier layer and the gate electrode collectively. Accordingly, the etching process can be simplified.

In an aspect of the method for fabricating thin-film semiconductor device according to the embodiment, the barrier layer and the metal layer are formed by sputtering, for example.

With this, the barrier layer and the metal layer can be continuously formed by sputtering, which simplifies the deposition process.

In an aspect of the thin-film semiconductor device according to the embodiment, the thin-film semiconductor device includes: a glass substrate; an undercoat layer, above the glass substrate, for inhibiting diffusion of an impurity in the glass substrate, the undercoat layer including a nitride film; a barrier layer above the undercoat layer; a gate electrode including molybdenum above the barrier layer; a gate insulating film above the gate electrode; a polysilicon layer above the gate insulating film; and a source electrode and a drain electrode above the polysilicon layer, in which the barrier layer includes (i) an element having a bonding force with an oxygen atom greater than that of the molybdenum or (ii) a compound of the element, the polysilicon layer is formed by annealing a non-crystalline silicon layer at a temperature higher than or equal to a melting temperature of the non-crystalline silicon layer for at least 0.1 μsec using a continuous-wave (CW) laser, and at least part of the barrier layer at an interface between the barrier layer and the undercoat layer is changed into a layer including oxygen as a major component.

With this, the oxygen atoms present on the surface of the undercoat layer are bonded with the barrier layer made of the material having the bonding force with oxygen greater than that of molybdenum, instead of the molybdenum in the gate electrode. Accordingly, the barrier layer stops the diffusion of the oxygen atoms, which inhibits the oxidation of the molybdenum in the gate electrode. Accordingly, even if high-temperature annealing performed at a temperature higher than or equal to the melting temperature of the amorphous silicon layer for at least 0.1 μsec using the continuous-wave laser, it is possible to inhibit the flake-off on the gate electrode.

In an aspect of the thin-film semiconductor device according to the embodiment, the barrier layer has a thickness of at least 10 nm, for example.

With this, even if all of the oxygen atoms included in the undercoat layer made of the nitride film is diffused to the barrier layer, it is possible that all of the oxygen atoms are bonded with the barrier layer.

In an aspect of the thin-film semiconductor device according to the embodiment, the undercoat layer has a thickness of at least 100 nm, for example.

With this, the undercoat layer can effectively inhibit the diffusion of sodium.

In an aspect of the thin-film semiconductor device according to the embodiment, the undercoat layer has a thickness of at least 400 nm, for example.

With this, it is possible to form a highly reliable undercoat layer without cracks.

In an aspect of the method for fabricating thin-film semiconductor device according to the embodiment, a concentration of oxygen atoms in the undercoat layer is in a range from $1 \times 10^{18}/cm^3$ to $1 \times 10^{21}/cm^3$.

With this, the oxygen atoms contained in the undercoat layer diffuse in the barrier layer, reducing the concentration of the oxygen atoms contained in the undercoat layer.

In an aspect of the thin-film semiconductor device according to the embodiment, the impurity in the glass substrate is sodium or phosphorus, for example.

Since the impurity in the glass substrate is sodium or phosphorus, the undercoat layer inhibits the impurity such as sodium or phosphorus contained in the glass substrate from entering the semiconductor layer.

In an aspect of the thin-film semiconductor device according to the embodiment, the glass substrate contains oxygen atoms as a major component, the undercoat layer has a force for bonding with oxygen atoms that is weaker than that of the glass substrate, and the molybdenum has a force for bonding with oxygen atoms that is weaker than that of the glass substrate and stronger than that of the undercoat layer, for example.

With this, the molybdenum is more likely to be oxidized than the undercoat layer. However, it is possible to suppress the oxidation of molybdenum by the barrier layer.

In an aspect of the thin-film semiconductor device according to the embodiment, a non-crystalline silicon layer is formed above the polysilicon layer, and the source electrode and the drain electrode are formed above the non-crystalline silicon layer, for example.

With this, it is possible to form the non-crystalline silicon layer between (i) the polysilicon layer and (ii) the source electrode or the drain electrode.

In an aspect of the thin-film semiconductor device according to the embodiment, the polysilicon layer includes a microcrystalline silicon layer having an average grain size in a range from 20 nm to 200 nm, for example.

Since the polysilicon layer is the microcrystalline silicon layer having the average grain size in a range from 20 nm to 200 nm, the carrier mobility is higher than an amorphous semiconductor. Accordingly, a thin-film semiconductor device having better on-characteristics can be achieved.

In an aspect of the thin-film semiconductor device according to the embodiment, the element having the force for bonding with the oxygen atom greater than that of the molybdenum is a metal, for example.

With this, the barrier layer may be formed of a metal having a bonding force with the oxygen atoms greater than that of molybdenum.

In an aspect of the thin-film semiconductor device according to the embodiment, the metal is any one of Fe, W, Nb, Cr, Mn, Ta, V, and Ti, for example.

With this, the metal having a large bonding force with oxygen is used as the material for the barrier layer. Accordingly, it is possible to promote the oxidation of the barrier layer more than the oxidation of the molybdenum.

In an aspect of the thin-film semiconductor device according to the embodiment, the gate electrode has a same shape as the barrier layer, for example.

With this, it is possible to form the barrier layer and the gate electrode collectively. Accordingly, the etching process can be simplified. In addition, the barrier layer and the metal layer can be continuously formed by sputtering, which simplifies the deposition process.

In another aspect of the method for fabricating the thin-film semiconductor device according to the embodiment feature: preparing a glass substrate; forming, above the glass substrate, an undercoat layer for inhibiting diffusion of an impurity in the glass substrate, the undercoat layer including a nitride film; forming a barrier layer above the undercoat layer; forming a metal layer including molybdenum above the barrier layer; forming a gate electrode from the metal layer by an etching process; forming a gate insulating film above the gate electrode; forming a non-crystalline silicon layer above the gate insulating film; forming a polysilicon layer by annealing the non-crystalline silicon layer at a temperature in a range from 700° C. to 900° C. for at least 1 second using a rapid thermal annealing (RTA), the non-crystalline silicon layer being crystallized by the annealing; and forming a source electrode and a drain electrode above the polysilicon layer, in which the barrier layer includes an element having a bonding force with an oxygen atom greater than that of the molybdenum or a compound of the element, and at least part of the barrier layer changes into a layer including oxygen atoms as a major component by the annealing when forming the polysilicon layer.

With this, the barrier layer can stop the diffusion of the oxygen atoms even when the non-crystalline silicon layer is crystallized by the rapid thermal annealing. Accordingly, it is possible to inhibit the oxidation of molybdenum comprising the gate electrode. Therefore, it is possible to inhibit the generation of the flake-offs on the gate electrode.

The following shall describe the thin-film semiconductor device and the method for fabricating the thin-film semiconductor device according to the present disclosure with reference to the embodiments.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of appended Claims and their equivalents. Therefore, among the structural elements in the following exemplary embodiments, structural elements not recited in any one of the independent claims are described as arbitrary structural elements.

Embodiment 1

First, a thin-film semiconductor device for display and a method for fabricating the thin-film semiconductor device for display according to the embodiment 1 shall be described with reference to the drawings.

Figure 1:
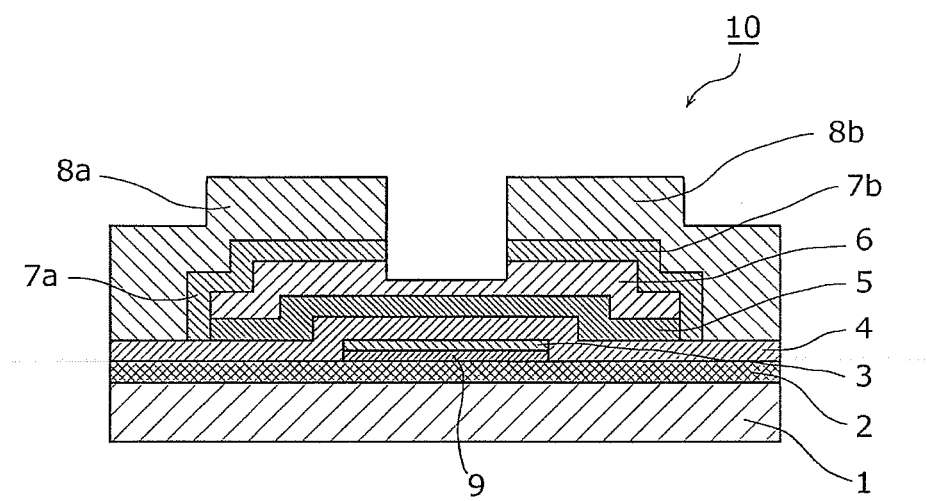
- FIG. 1 is a cross-sectional view schematically illustrating a thin-film semiconductor device for display according to the embodiment 1.

First, a thin-film semiconductor device 10 for display according to the embodiment 1 shall be described with reference to FIG. 1. FIG. 1 is a cross-sectional view schematically illustrating a thin-film semiconductor device for display 10 according to the embodiment 1.

As illustrated in FIG. 1, the thin-film semiconductor device for display 10 according to the embodiment 1 is a bottom-gate thin-film transistor device, and includes a glass substrate 1, and the following layers sequentially formed above the glass substrate 1: an undercoat layer 2; a barrier layer 9; a gate electrode 3; a gate insulating film 4; a polycrystalline semiconductor layer 5; a non-crystalline semiconductor layer 6; a pair of contact layers 7a and 7b; and a source electrode 8a and a drain electrode 8b, which constitutes a pair. The characteristic configuration of the thin-film semiconductor device for display 10 according to the embodiment 1 is that the barrier layer 9 is included between the undercoat layer 2 and the gate electrode 3.

The glass substrate 1 is composed of a glass material such as quartz glass, for example.

The undercoat layer 2 is formed on the surface of the glass substrate 1 for inhibiting impurity such as sodium or phosphorus included in the glass substrate 1 from entering the semiconductor layer. The impurity in the glass substrate 1 is included in the process of forming the glass substrate 1 itself.

As the material for the undercoat layer 2, a nitride film such as silicon nitride (SiN) may be used, for example. Note that, as the material for the undercoat layer 2, it is possible to use a different insulating film such as silicon dioxide. However, a nitride film such as a silicon nitride film is used for inhibiting the entrance of the impurity in the glass substrate 1 from entering the semiconductor layer, for example. By having the thickness of approximately 100 nm, the silicon nitride film can sufficiently inhibit the dispersion of the impurity in the glass substrate 1 to outside of the glass substrate 1.

The gate electrode 3 is formed of a metal including molybdenum (Mo) such as molybdenum tungsten (MoW), and is formed on the barrier layer 9 to be described later. The thickness of the gate electrode 3 is approximately 50 nm.

The gate insulating film 4 is composed of silicon dioxide ($SiO_2$), silicon nitride (SiN) or a stacked film of these materials, for example, and is formed on the glass substrate 1 and the gate electrode 3, covering the gate electrode 3. In this embodiment, the polycrystalline semiconductor layer 5 is used as a channel layer. Accordingly, silicon dioxide is used as the gate insulating film 4, for example. The reason for this is that it is preferable to have a good interface state between the gate insulating film 4 and the channel layer for maintaining excellent threshold voltage characteristics of the TFT, and silicon dioxide is suitable for this purpose. Note that the thickness of the gate insulating film 4 is approximately in a range from 100 to 150 nm.

The polycrystalline semiconductor layer 5 is a first channel layer formed on the gate insulating film 4, and is a polysilicon layer in this embodiment. Note that, the polycrystalline semiconductor layer 5 includes a microcrystalline semiconductor layer (microcrystalline silicon layer) having an average grain size in a range from 20 nm to 200 nm. The polycrystalline semiconductor layer 5 is a crystallized silicon layer formed by crystallizing amorphous silicon, and has microcrystalline structure referred to as micro crystals.

The non-crystalline semiconductor layer 6 is a second channel layer formed on the polycrystalline semiconductor layer 5, and is composed of a non-crystalline silicon layer such as an amorphous silicon layer, for example.

As described above, the thin-film semiconductor device for display 10 according to this embodiment includes a two-layered channel layer having the first channel layer composed of the polycrystalline semiconductor layer 5 and the second channel layer composed of the non-crystalline semiconductor layer 6. Note that, the polycrystalline semiconductor layer 5 and the non-crystalline semiconductor layer 6 are formed in island shape in a plan view.

The pair of contact layers 7a and 7b is composed of an amorphous semiconductor layer containing impurity at high concentration, and is formed on the non-crystalline semiconductor layer 6. Note that the contact layer 7a and the contact layer 7b are formed apart from each other. Each of the contact layers 7a and 7b is formed to cover the upper surface and a side surface of an end portion of the non-crystalline semiconductor layer 6 and a side surface of the polycrystalline semiconductor layer 5, and is formed from the upper surface of the non-crystalline semiconductor layer 6 to a surface above the glass substrate 1. In this embodiment, each of the contact layers 7a and 7b is an n-type semiconductor layer in which amorphous silicon layer is doped with phosphorus (P) as the impurity, and is an $n^+$ layer including a high concentration of impurity of at least $1\times10^{19}$ ($atm/cm^3$).

The source electrode 8a and the drain electrode 8b which constitutes a pair are formed on the contact layers 7a and 7b, respectively, and are formed apart from each other. The source electrode 8a and the drain electrode 8b are made of single-layer structure or a multi-layer structure of a conductive material, an alloy including the conductive material, or the like, and are made of, for example, aluminum (Al), molybdenum (Mo), tungsten (W), copper (Cu), titanium (Ti), chromium (Cr), or others. In this embodiment, the source electrode 8a and the drain electrode 8b are formed as a tri-layer structure of MoW/Al/MoW.

The barrier layer 9 is an oxidation-preventing layer for preventing oxidation of molybdenum contained in the gate electrode 3, and is formed on the undercoat layer 2. The barrier layer 9 is composed of a metal element having a bonding force with the oxygen atoms greater than that of molybdenum or a compound including the metal element at a temperature greater than or equal to 700° C.

The bonding force with the oxygen atoms depends on the standard free energy of formation ($\Delta G^0$) of the oxide, and the larger the absolute value of the standard free energy of formation, the stronger the bonding force with the oxygen atoms becomes. In contrast, the smaller the absolute value of the standard free energy of formation, the weaker the bonding force with the oxygen atoms becomes.

Here, the absolute value of the standard free energy of formation of molybdenum oxide ($MoO_3$) at 800° C. ($|-\Delta G^0_{Mo}|$) is 395.6 (kJ/mol). Examples of metal elements configuring metal oxide having a standard free energy of formation larger than the absolute value ($|-\Delta G^0_{Mo}|$) of the standard free energy of formation of molybdenum oxide ($MoO_3$) include Sn (tin), Fe (iron), W (tungsten), Nb (niobium), Cr (chromium), Mn (manganese), Ta (tantalum), V (vanadium), Si (silicon), and Ti (titanium) and others.

The standard free energies of formation of the oxides of the metal elements at 800° C. is as follows: the absolute value of the standard free energy of formation of tin oxide (SnO) ($|-\Delta G^0_{Sn}|$) is 410.2 (kJ/mol); the absolute value of the standard free energy of formation of iron oxide (FeO) ($|-\Delta G^0_{Fe}|$) is 422.8 (kJ/mol); the absolute value of the standard free energy of formation of tungsten oxide ($WO_2$) ($|-\Delta G^0_{W}|$) is 439.5 (kJ/mol); the absolute value of the standard free energy of formation of niobium oxide ($Nb_2O_5$) ($|-\Delta G^0_{Nb}|$) is 623.7 (kJ/mol); the absolute value of the standard free energy of formation of chromium oxide ($Cr_2O_3$) ($|-\Delta G^0_{Cr}|$) is 623.7 (kJ/mol); the absolute value of the standard free energy of formation of manganese oxide (MnO) ($|-\Delta G^0_{Mn}|$) is 653.0 (kJ/mol); the absolute value of the standard free energy of formation of tantalum oxide ($Ta_2O_5$) ($|-\Delta G^0_{Ta}|$) is 671.8 (kJ/mol); the absolute value of the standard free energy of formation of vanadium oxide ($V_2O_3$) ($|-\Delta G^0_{V}|$) is 690.7 (kJ/mol); the absolute value of the standard free energy of formation of silicon oxide ($SiO_2$) ($|-\Delta G^0_{Si}|$) is 736.7 (kJ/mol); and the absolute value of the standard free energy of formation of titanium oxide (TiO) ($|-\Delta G^0_{Ti}|$) is 2004.6 (kJ/mol).

In this embodiment, the annealing process in which the temperature is high at greater than or equal to 700° C. is included as the process for crystallizing the non-crystalline silicon layer. Accordingly, it is not preferable to use a material having a melting point lower than 700° C. as the material for the barrier layer 9. Sn and Al have the melting points lower than 700° C. Accordingly, Sn and Al are not suitable as the barrier layer according to the embodiment. In addition, the melting point of Ce is approximately 800° C. Accordingly, Ce is not suitable as the material for the barrier layer 9 when the annealing temperature exceeds 800° C. Therefore, among the metal elements, metal elements having high melting points of at least 900° C., that is, Fe, W, Nb, Cr, Mn, Ta, V, Si, and Ti are preferably used as the barrier layer 9.

If the metals having high melting points are used as the barrier layer 9, the relationship between the standard free energy of formation in the barrier layer ($|-\Delta G^0_{barrier}|$) and the standard free energy of formation in the molybdenum oxide ($MoO_3$) ($|-\Delta G^0_{Mo}|$) satisfies ($|-\Delta G^0_{barrier}|$)>($|-\Delta G^0_{Mo}|$). With this, the barrier layer 9 is more likely to be oxidized than the gate electrode 3 made of molybdenum. Accordingly, at the annealing temperature higher than or equal to 700° C., the oxygen atoms present in the proximity of the surface of the undercoat layer 2 are bonded with the metal composing the barrier layer 9 rather than the gate electrode 3. This promotes the oxidation of the barrier layer 9. To put it differently, the oxygen atoms present around the interface between the undercoat layer 2 and the barrier layer 9 are used for oxidizing the metal in the barrier layer 9. Consequently, the oxidation of molybdenum in the gate electrode 3 is inhibited.

Note that, the barrier layer 9 may be formed of a single element of the metals, or a compound of the metals such as TiW.

Figure 2:
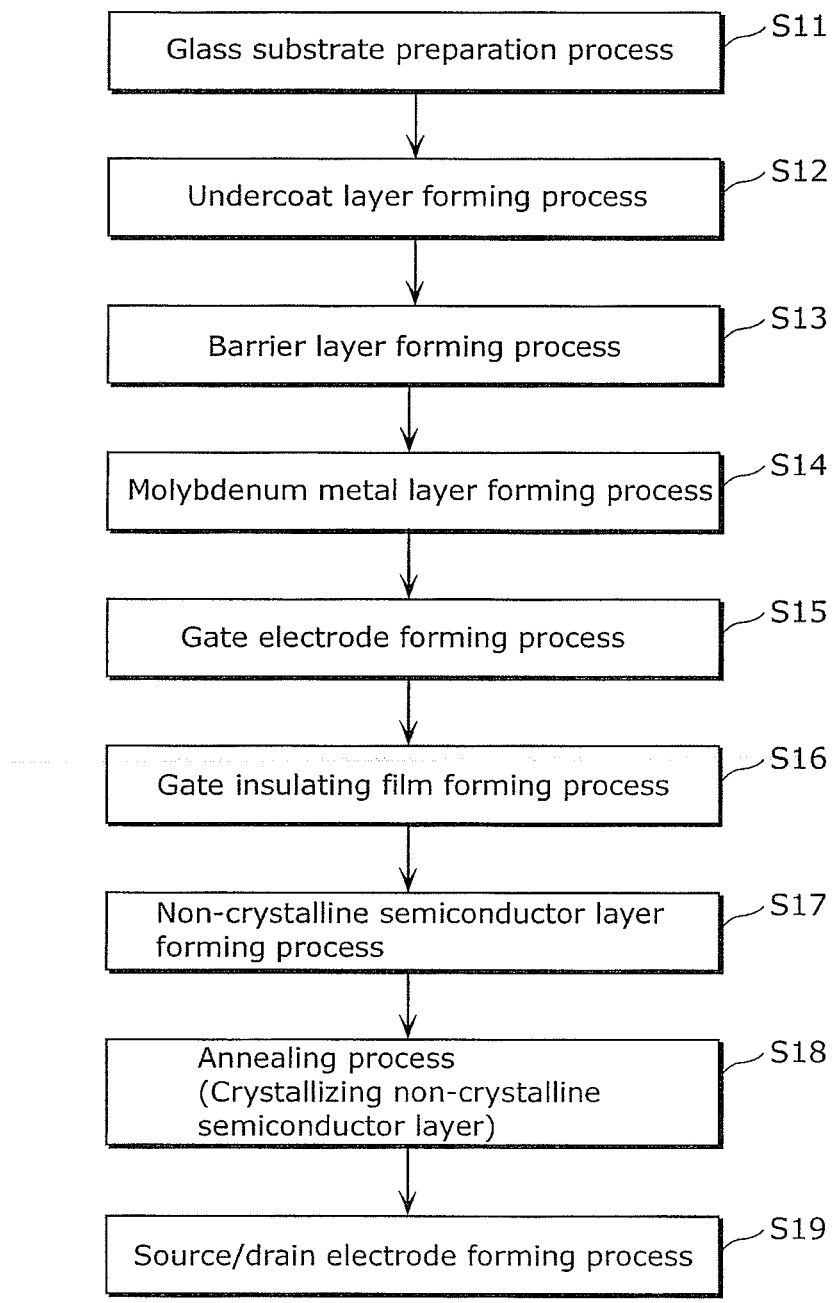
FIG. 2 is a flowchart illustrating a method for fabricating a thin-film semiconductor device for display according to the embodiment 1.

Next, a method for fabricating a thin-film semiconductor device for display 10 according to the embodiment 1 shall be described with reference to FIG. 2 to FIG. 4. FIG. 2 is a flowchart illustrating the method for fabricating the thin-film semiconductor device for display 10 according to the embodiment 1.

As illustrated in FIG. 2, the method for fabricating the thin-film semiconductor device for display 10 according to the embodiment 1 includes at least a glass substrate preparation process (S11), an undercoat layer forming process (S12), a barrier layer forming process (S13), a molybdenum metal layer forming process (S14), a gate electrode forming process (S15), a gate insulating film forming process (S16), a non-crystalline semiconductor layer forming process (S17), an annealing process (S18), and a source/drain electrode forming process (S19) in order.

The glass substrate preparation process (S11) is a process for preparing a predetermined glass substrate.

The undercoat layer forming process (S12) is a process for forming the undercoat layer 2 on the glass substrate 1.

The barrier layer forming process (S13) is a process for forming the barrier layer 9 on the undercoat layer 2.

The molybdenum metal layer forming process (S14) is a process for forming a molybdenum metal layer composed of a material containing molybdenum, which is a material for the gate electrode 3 on the barrier layer 9.

The gate electrode forming process (S15) is a process for forming the gate electrode 3 by patterning the molybdenum metal layer by predetermined etching process.

The gate insulating film forming process (S16) is a process for forming the gate insulating film 4 on the gate electrode 3.

The non-crystalline semiconductor layer forming process (S17) is a process for forming a first non-crystalline semiconductor layer such as an amorphous silicon layer on the gate insulating film 4.

The annealing process (S18) is a process for annealing the non-crystalline semiconductor layer on the gate insulating film 4 at a temperature in a predetermined range. The non-crystalline semiconductor layer is crystallized by the annealing process, forming the polycrystalline semiconductor layer 5.

The source/drain electrode forming process (S19) is a process for forming the source electrode 8a and the drain electrode 8b above the polycrystalline semiconductor layer 5.

Note that, the method for fabricating the thin-film semiconductor device for display 10 according to the embodiment 1 includes processes in addition to the processes described above.

Note that, a specific method for fabricating the thin-film semiconductor device for display 10 according to the embodiment 1 shall be described in more detail with reference to FIG. 3 and FIG. 4 including the processes not described above. FIG. 3 and FIG. 4 are cross-sectional views schematically illustrating the method for fabricating the thin-film semiconductor device for display 10 according to the embodiment 1.

(Glass Substrate Preparation Process: S11)

Figure 3:
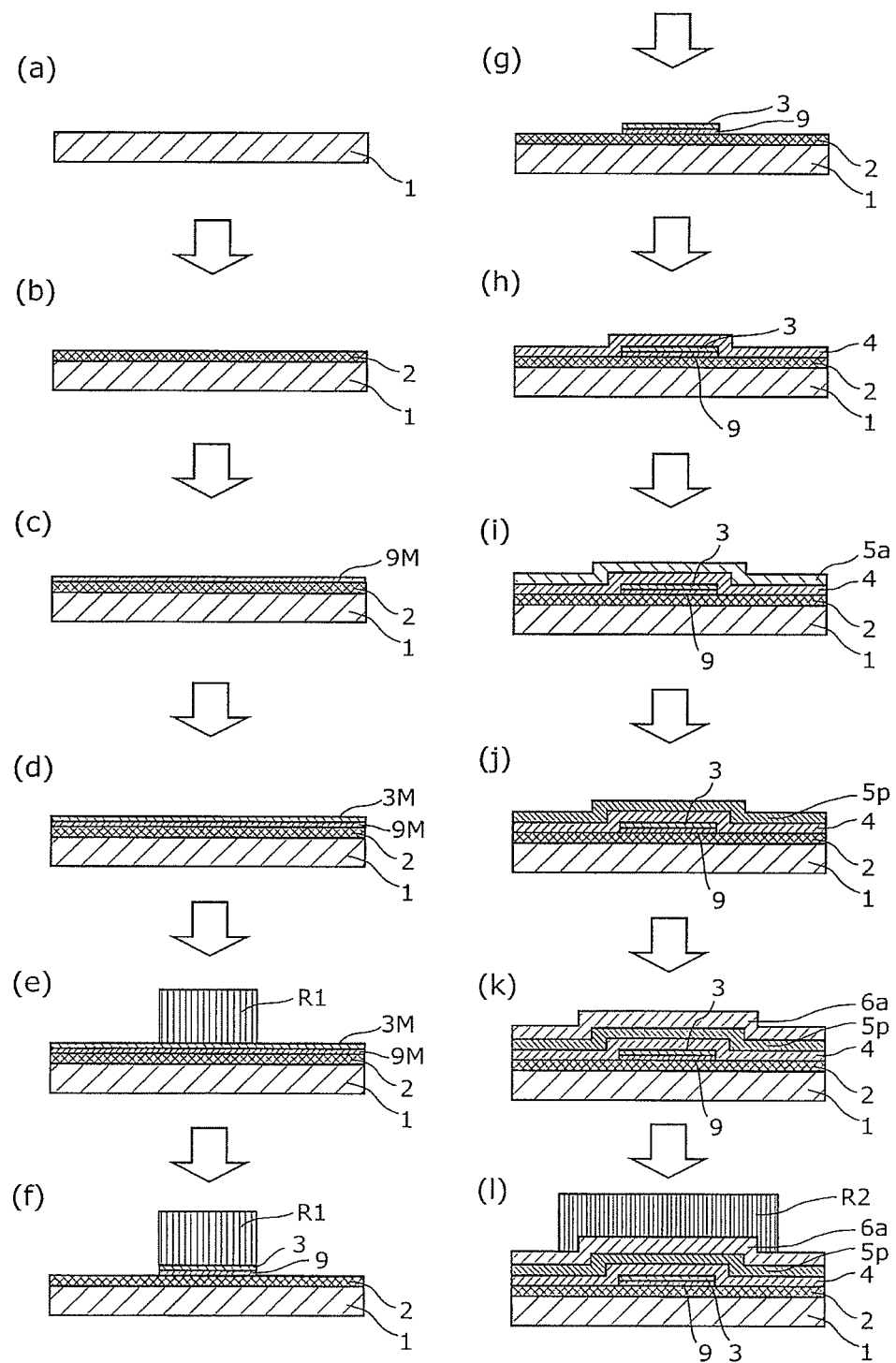
FIG. 3 is a cross-sectional view schematically illustrating processes in the method for fabricating the thin-film semiconductor device for display according to the embodiment 1.

First, as illustrated in (a) in FIG. 3, the glass substrate 1 made of a glass material such as quartz glass is prepared. Note that, the glass substrate 1 is cleaned, for example.

(Undercoat Layer Forming Process: S12)

Next, as illustrated in (b) in FIG. 3, the undercoat layer 2 which is an insulating film made of the silicon nitride film is formed on the glass substrate 1. The silicon nitride film can be formed by the plasma CVD. The thickness of the undercoat layer 2 is approximately 100 nm.

(Barrier Layer Forming Process: S13)

After washing pure water or others, a barrier layer forming film 9M made of Ti is formed on the undercoat layer 2, as illustrated in (c) in FIG. 3. The barrier layer forming film 9M can be formed by sputtering. In this embodiment, the thickness of the barrier layer forming film 9M is approximately 50 nm. Other than Ti, metals having high melting points of greater than or equal to 900° C. such as Fe, W, Nb, Cr, Mn, Ta, V, Si, or others may be used as the material for the barrier layer forming film 9M.

(Molybdenum Metal Layer Forming Process: S14)

Next, a molybdenum metal layer 3M (gate metal layer) formed of a material containing molybdenum is formed to have a thickness of approximately 50 nm on the barrier layer forming film 9M, as illustrated in (d) in FIG. 3. In this embodiment, molybdenum tungsten (MoW) is used as the molybdenum metal layer 3M. Furthermore, the molybdenum metal layer 3M is deposited by sputtering.

(Gate Electrode Forming Process: S15)

Next, resist is applied on the molybdenum metal layer 3M, and the resist is exposed to light and developed such that the resist remains in a part where the gate electrode is to be formed, and the resist R1 is selectively formed, as illustrated in (e) in FIG. 3.

Next, as illustrated in (f) in FIG. 3, wet etching is performed using the remaining resist R1 as a mask, patterning the molybdenum metal layer 3M and the barrier layer forming film 9M. Subsequently, by removing the resist and cleaning the surface, the gate electrode 3 and the barrier layer 9 in the predetermined shape are formed on the undercoat layer 2, as illustrated in (g) in FIG. 3.

As described above, the wet etching in the embodiment is collectively performed on the molybdenum metal layer 3M and the barrier layer forming film 9M. More specifically, the molybdenum metal layer 3M and the barrier layer forming film 9M are etched at the same time in the same etching process. With this process, the gate electrode 3 and the barrier layer 9 are patterned to have the same shape. Note that, in this case, the gate electrode 3 and the barrier layer 9 may be regarded as one gate electrode.

(Gate Insulating Film Forming Process: S16)

Next, as illustrated in (h) in FIG. 3, the gate insulating film 4 made of silicon dioxide having the thickness of approximately 100 nm is deposited on the gate electrode 3 and the exposed part of the undercoat layer 2 so as to cover the gate electrode 3. The gate insulating film 4 can be deposited by the plasma CVD or others.

(First Non-Crystalline Semiconductor Layer Forming Process: S17)

Next, as illustrated in (i) in FIG. 3, the non-crystalline semiconductor layer 5a made of a non-crystalline silicon layer is deposited on the gate insulating film 4 as the first non-crystalline semiconductor layer. In this embodiment, the non-crystalline semiconductor layer 5a is an amorphous silicon layer, and is deposited to have the thickness of approximately 50 nm by the plasma CVD or others.

(Annealing Process: S18)

After the dehydrogenation annealing at 500° C. is performed, crystallization annealing is performed on the non-crystalline semiconductor layer 5a at a temperature in a range from 700° C. to 1400° C. With this, the non-crystalline semiconductor layer 5a which is the non-crystalline silicon layer is crystallized, and the polycrystalline semiconductor layer 5p which is the polysilicon layer is formed, as illustrated in (j) in FIG. 3.

The crystallization annealing on the non-crystalline silicon layer in this embodiment is performed at a temperature higher than or equal to the melting temperature of the non-crystalline silicon (1100° C.) for 0.1 μsec, using the continuous wave laser (CW laser). Unlike the annealing using the pulse laser, the annealing using the CW laser is performed by continuously irradiating the non-crystalline silicon layer to be crystallized with laser.

As described above, by performing laser annealing on the non-crystalline silicon layer, amorphous silicon having a crystal growth temperature of 600° C. is crystallized, forming the polysilicon layer having microcrystalline structure having micro crystals.

(Second Non-Crystalline Semiconductor Layer Forming Process)

Next, after the hydrogenation by the hydrogen plasma treatment using $H_2$ on the polycrystalline semiconductor layer 5p, the non-crystalline semiconductor layer 6a made of non-crystalline silicon layer as the second non-crystalline semiconductor layer is deposited on the polycrystalline semiconductor layer 5p, as illustrated in (k) in FIG. 3. In this embodiment, the non-crystalline semiconductor layer 6a is an amorphous silicon layer, and is deposited to have the thickness of approximately 100 nm by the plasma CVD or others.

(Channel Layer Island Forming Process)

Next, a resist is applied on the non-crystalline semiconductor layer 6a, and the resist is exposed to light and developed. As a result, a resist R2 is selectively formed, such that a part on which the channel layer is to be formed remains, as illustrated in (l) in FIG. 3.

Next, dry etching is performed using the remaining resist R2 as a mask, so as to pattern the non-crystalline semiconductor layer 6a and the polycrystalline semiconductor layer 5p. As a result, the polycrystalline semiconductor layer 5 and the non-crystalline semiconductor layer 6 which have island shape are formed, as illustrated in (a) in FIG. 4. Subsequently, as illustrated in (b) in FIG. 4, by removing the resist and cleaning the surface, the channel layer in island shape having two-layered structure including the first channel layer which is the polycrystalline semiconductor layer 5, the lower layer, and the second channel layer which is the non-crystalline semiconductor layer 6, the upper layer.

(Contact Layer Forming Film Forming Process)

Figure 4:
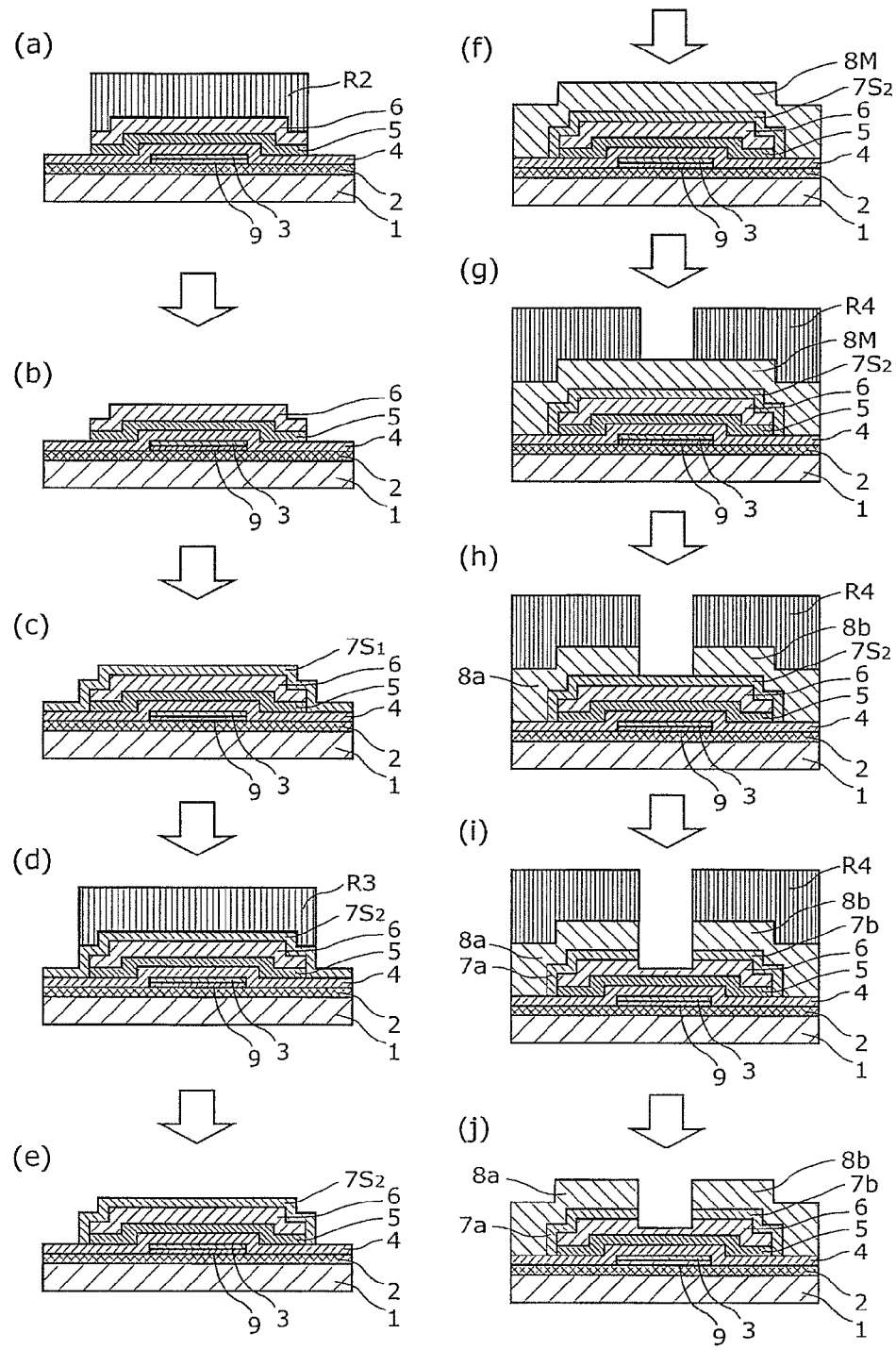
FIG. 4 is a cross-sectional view schematically illustrating processes in the method for fabricating the thin-film semiconductor device for display according to the embodiment 1.

Next, as illustrated in (c) in FIG. 4, an amorphous semiconductor layer $7S_1$ to be the contact layer made of the amorphous silicon layer doped with impurity is deposited on the non-crystalline semiconductor layer 6 and the glass substrate 1 by the plasma CVD or others. A pentavalent element such as phosphorus can be used as the impurity, for example. In addition, the flow rate of the gas is adjusted such that the concentration of the impurity is high.

Next, in order to form the contact layer in the predetermined shape, a resist is applied on the amorphous semiconductor layer $7S_1$ doped with impurity at high concentration, and the resist is exposed to light and developed. As a result, the resist R3 in the predetermined shape is selectively formed, as illustrated in (d) in FIG. 4. Subsequently, dry etching is performed using the resist R3 as a mask for patterning the amorphous semiconductor layer $7S_1$ doped with impurity at high concentration. Here, the amorphous semiconductor layer $7S_1$ doped with impurity at high concentration is patterned to cover the upper surface and the side surfaces of the non-crystalline semiconductor layer 6 and the side surfaces of the polycrystalline semiconductor layer 5, forming an amorphous semiconductor layer $7S_2$ doped with impurity at high concentration, which is a contact layer forming film. Subsequently, as illustrated in (e) in FIG. 4, by removing the resist R3 and cleaning the surface, the amorphous semiconductor layer 7S₂ doped with impurity at high concentration, which is the contact layer forming film, is exposed.

(Source/Drain Electrode Forming Process: S19)

Next, the source/drain metal film 8M made of a material composing the source electrode 8a and the drain electrode 8b is deposited on the amorphous semiconductor layer 7S₂ doped with impurity at high concentration and on the glass substrate 1, as illustrated in (f) in FIG. 4. In this embodiment, the source/drain metal film 8M having a tri-layer structure of MoW/Al/MoW is formed by sputtering.

Next, resist is applied on the source/drain metal film 8M for forming the source electrode 8a and the drain electrode 8b in the predetermined shape, and the resist is exposed to light and developed, so as to selectively form a resist R4 in the predetermined shape as illustrated in (g) in FIG. 4.

Next, wet etching is performed using the resist R4 as a mask for patterning the source/drain metal film 8M. As a result, the source electrode 8a and the drain electrode 8b in the predetermined shape are formed, as illustrated in (h) in FIG. 4. Note that, here, the amorphous semiconductor layer 7S₂ doped with impurity at high concentration functions as an etching stopper.

(Contact Layer Forming Process/Channel Etching Process)

Next, as illustrated in (i) in FIG. 4, dry etching is performed using the resist R4 as a mask so as to etch the amorphous semiconductor layer 7S₂ doped with impurity at high concentration which is exposed, and to etch the upper layer of the non-crystalline semiconductor layer 6. By separating the amorphous semiconductor layer 7S₂ doped with impurity as described above, a pair of contact layers 7a and 7b which is a pair of n⁺ layers is formed. Furthermore, by etching the upper layer of the non-crystalline semiconductor layer 6, the channel layer having a desired thickness is formed.

Subsequently, by removing the resist R4 and cleaning the surface, the thin-film semiconductor device for display according to the embodiment 1 is complete, as illustrated in (j) in FIG. 4.

Note that, although not illustrated, a passivation film may be formed to cover the entire thin-film semiconductor device for display.

Actions and Effects of the Present Disclosure

Figure 5:
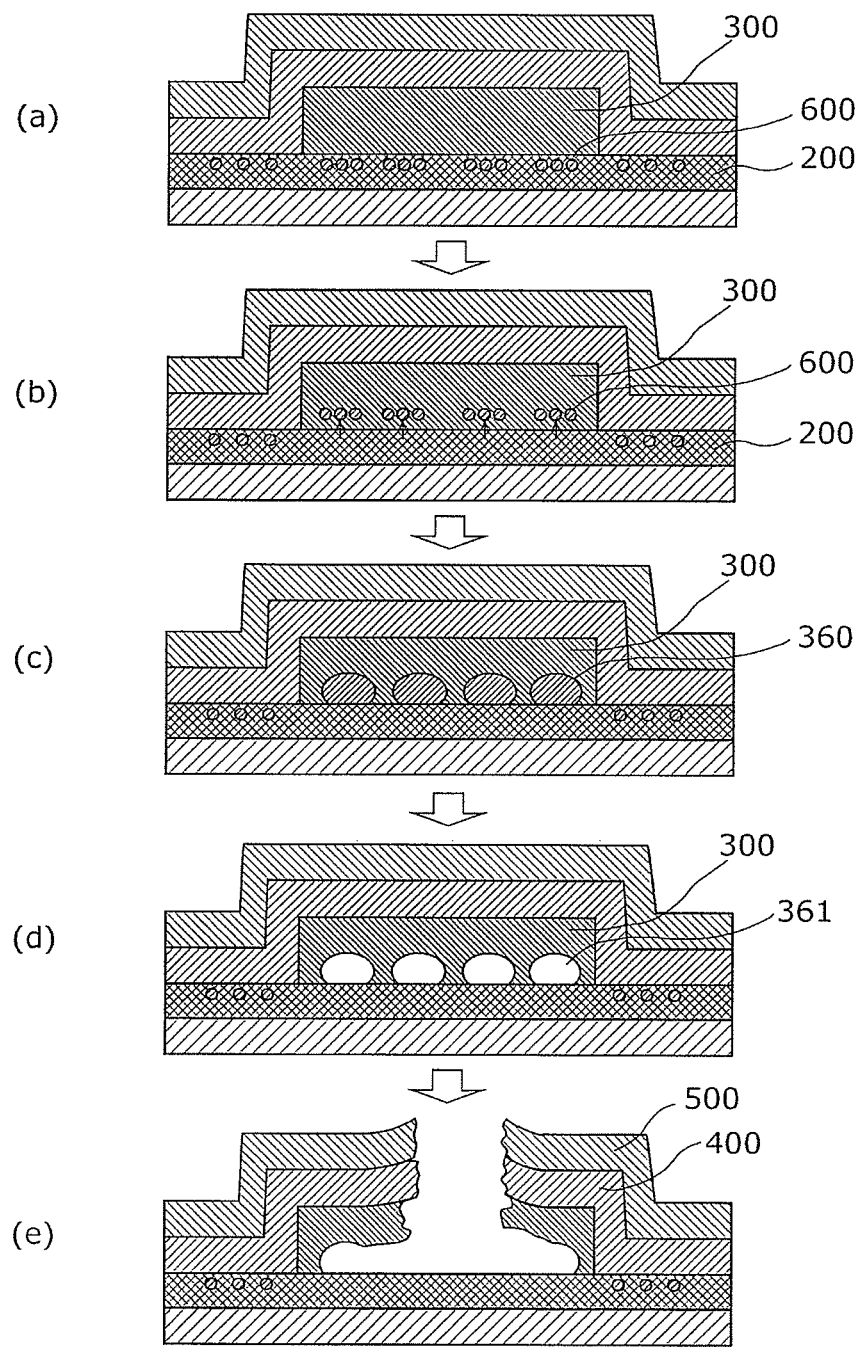
FIG. 5 is a schematic diagram for describing a cause of flake-off in the thin-film semiconductor device for display.
Figure 6:
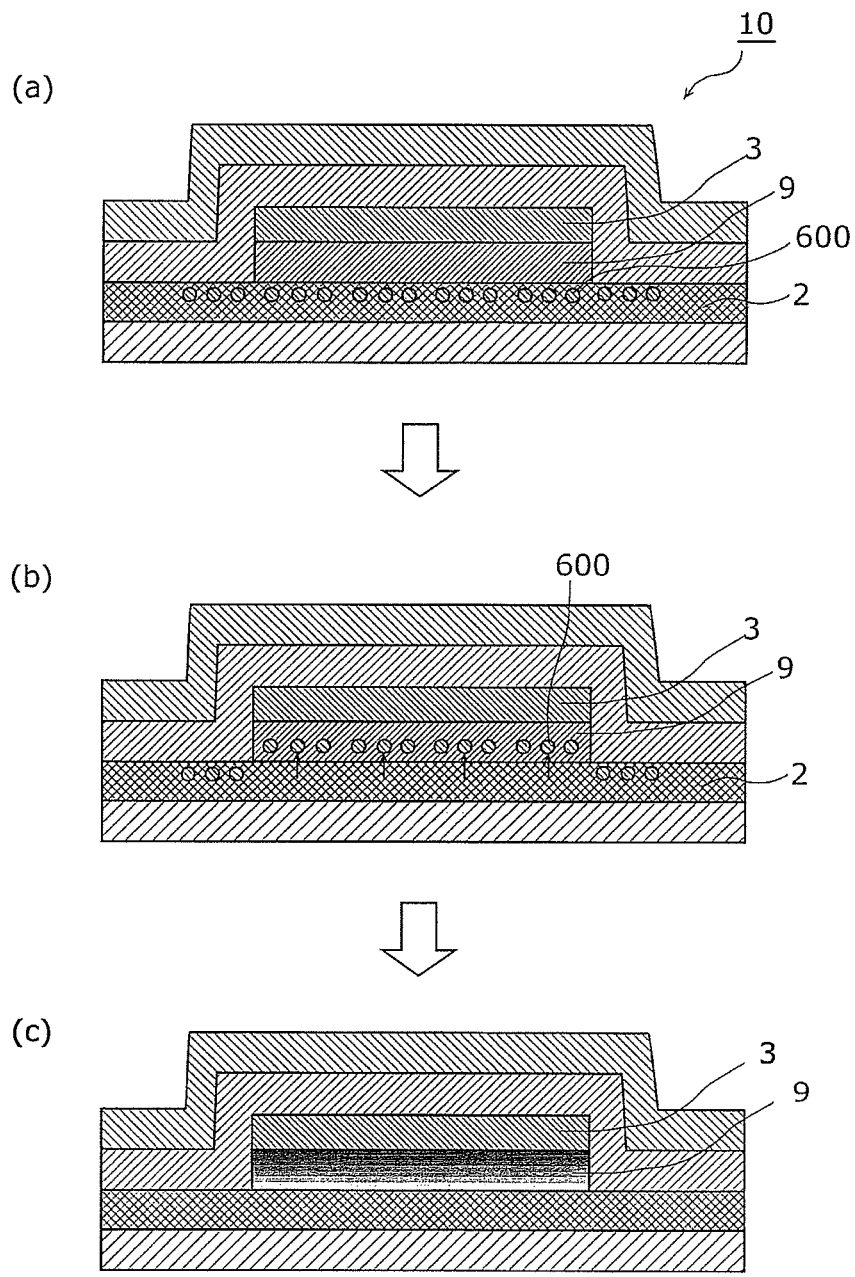
FIG. 6 is a schematic view for illustrating the actions in the thin-film semiconductor device according to the present disclosure.

Next, actions and effects in the method for fabricating the thin-film semiconductor device for display 10 according to the embodiment 1 shall be described in detail with reference to FIG. 5 and FIG. 6. FIG. 5 is a schematic diagram for describing a cause of flake-off in the thin-film semiconductor device for display. FIG. 6 is a schematic view for illustrating the actions in the thin-film semiconductor device according to the present disclosure.

As described above, in the conventional thin-film semiconductor device for display, the non-crystalline semiconductor layer (non-crystalline silicon layer) is crystallized by annealing the non-crystalline semiconductor layer using the CW laser for forming the polycrystalline semiconductor layer (polysilicon layer) at a temperature in a range from 700° C. to 1400° C. However, as illustrated in FIG. 19A, there is a problem that the annealing causes flake-offs in various sizes on the gate electrode.

After diligent consideration on the mechanism of the problem, the inventors found out that the problem is caused for the following reasons.

First, there is a case in which molybdenum oxide (MoO₃) is formed when molybdenum is used as the material for the gate electrode, and the inventors found out the problem is caused by molybdenum oxide. More specifically, if molybdenum oxide is formed in the gate electrode, molybdenum oxide sublimes by annealing at a temperature in a range from 700° C. to 1400° C. and turn into gas. This is because molybdenum oxide has a melting point of approximately 800° C. and has a tendency to sublime. With this, gas is present inside and around the gate electrode, making the film formed on the gate electrode likely to fall off.

After consideration on the cause of the formation of the molybdenum oxide, the inventors found out that the undercoat layer present under the gate electrode is the cause. The following shall specifically describe the cause.

The undercoat layer is formed for inhibiting the negative influence of the glass board, which is the substrate, on the thin-film semiconductor device. More specifically, impurities such as sodium or phosphorus are included in the forming process of the glass board itself. However, if the impurities such as sodium or phosphorus enter the semiconductor layer in the channel layer, the impurities function as electric charges, causing leakage current and a shift of threshold voltage to a negative side. The undercoat layer is formed to block the impurities in the glass board entering the semiconductor layer. As the undercoat layer, a nitride film such as silicon nitride is usually used for blocking the entering impurity more effectively.

The inventors found out that, when a gate electrode containing molybdenum is directly formed on the silicon nitride film, a layer rich in oxygen having a high oxygen content rate is formed on the surface of the silicon nitride film in a process for fabricating the thin-film semiconductor device. Stated differently, as illustrated in (a) in FIG. 5, it is assumed that the layer rich in oxygen containing more oxygen atoms 600 than another region exists in the proximity of the surface of the undercoat layer 200 which is the nitride film, that is, in an upper layer of the undercoat layer 200 or between the undercoat layer 200 and the gate electrode 300.

In terms of the force for bonding with the oxygen atoms, molybdenum has a bonding force for bonding with oxygen atoms greater than the nitride film. Accordingly, the oxygen atoms below the gate electrode 300 among the oxygen atoms 600 present in the proximity of the surface of the undercoat layer 200 which is a nitride film are diffused toward the gate electrode 300 containing molybdenum, as illustrated in (b) in FIG. 5.

With this, as illustrated in (c) in FIG. 5, the diffused oxygen atoms 600 are combined with molybdenum of the gate electrode 300, forming molybdenum oxide 360. Note that, the nitride film has a smaller force for bonding with the oxygen atoms than that of the glass substrate. In addition, although molybdenum has a weaker bonding force with the oxygen atoms than that of the glass substrate, molybdenum has a larger bonding force with the oxygen atoms than that of the nitride film.

As described above, the bonding force with the oxygen atoms is higher in molybdenum than in the nitride film. Accordingly, molybdenum is more likely to be oxidized than the nitride film, and thus molybdenum oxide 360 is formed by the diffused oxygen atoms 600.

In this state, in order to crystallize the non-crystalline semiconductor layer, annealing is performed. Here, as illustrated in (d) in FIG. 5, the molybdenum oxide 360 sublimes and turns into gas. Accordingly, gas 361 is present inside and around the gate electrode 300.

Subsequently, as illustrated in (e) in FIG. 5, when the gas 361 is released from inside the gate electrode 300, the gate insulating film 400 and the polycrystalline semiconductor layer 500 above the gate electrode 300 flake off.

In particular, if the annealing process is performed at a high temperature greater than or equal to the melting temperature of the non-crystalline silicon (1100° C.), molybdenum oxide in the gate electrode is more likely to turn into gas, which would make the flake-off more likely.

The present disclosure has been conceived in order to solve the problem, and in the thin-film semiconductor device for display 10 according to the embodiment 1, the barrier layer 9 is formed between the undercoat layer 2 and the gate electrode 3 as illustrated in (a) in FIG. 6, using a material having a bonding force with oxygen atoms greater than the bonding force of molybdenum.

With this, even if the oxygen atoms 600 present in the surface of the undercoat layer 2 diffuses in the direction of the gate electrode 3 by the annealing, as illustrated in (b) in FIG. 6, the diffused oxygen atoms 600 are bonded with the material of the barrier layer 9, having a bonding force with oxygen greater than that of molybdenum, instead of bonding with the molybdenum in the gate electrode 3. More specifically, at least part of the barrier layer 9 changes to a layer having the oxygen atoms as the main component. For example, when the barrier layer 9 is made of Ti (titanium), part of Ti in the barrier layer 9 is oxidized, forming the oxidized layer made of $TiO_2$ (titanium dioxide).

As described above, by oxidizing the barrier layer 9, it is possible to keep the diffusing oxygen atoms 600 staying in the barrier layer 9 so as to inhibit the oxygen atoms 600 from diffusing into the gate electrode 3. With this, it is possible to inhibit the molybdenum in the gate electrode 3 from oxidizing.

Note that, the barrier layer 9 is bonded with the oxygen atoms 600 from the lower part. More specifically, the barrier layer 9 is oxidized from the part in the proximity of the interface between the barrier layer 9 and the undercoat layer 2. Accordingly, as illustrated in (c) in FIG. 6, the concentration of the oxygen atoms in the area in the barrier layer 9 bonded with the oxygen atoms 600 (oxidized region) gradually increases from the lower part to the upper part of the barrier layer 9, that is, from the side closer to the undercoat layer 2 toward the side closer to the gate electrode 3 in the barrier layer 9.

As described above, the barrier layer 9 inhibits the oxidation of molybdenum in the gate electrode 3. Accordingly, it is possible to significantly decrease the probability of molybdenum oxide subliming and turning into gas by the temperature of the annealing. With this, it is possible to prevent the film on the gate electrode from flaking.

Furthermore, as described in the embodiment, when the undercoat layer 2 is composed of the nitride film such as SiN, there is a tendency that the oxygen atoms around the nitride film is likely to be diffused, since the bonding force of the nitride film with oxygen is weak. Accordingly, in this case, if the gate electrode 3 made of molybdenum is formed immediately on the undercoat layer 2; the molybdenum in the gate electrode 3 is more likely to be oxidized.

In contrast, if the nitride film is included in the undercoat layer 2, as illustrated in the embodiment, by forming the barrier layer 9 between the undercoat layer 2 and the gate electrode 3 prevents the diffusion of the oxygen atoms. Accordingly, it is possible to inhibit the oxidation of molybdenum in the gate electrode 3.

Furthermore, in the embodiment, the annealing process for crystallizing the non-crystalline semiconductor layer (non-crystalline silicon layer) is performed by the CW laser, and the annealing is performed such that the temperature of the laser irradiated on the non-crystalline semiconductor layer is at a temperature greater than or equal to the melting temperature of the non-crystalline silicon (1100° C.), and that the irradiation time of the laser on the non-crystalline semiconductor layer is 0.1 µsec.

Figure 7A:
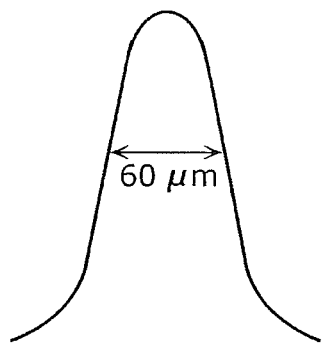
FIG. 7A illustrates a beam profile (short-axis) of a CW laser used for the annealing in the method for fabricating the thin-film semiconductor device for display according to the embodiment 1.
Figure 7B:
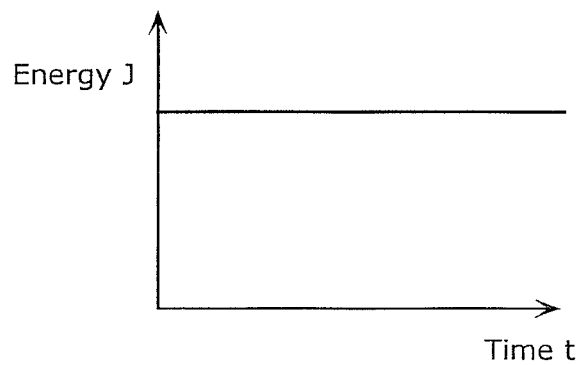
FIG. 7B illustrates an oscillation state of the laser when performing annealing using the CW laser illustrated in FIG. 7A.
Figure 8A:
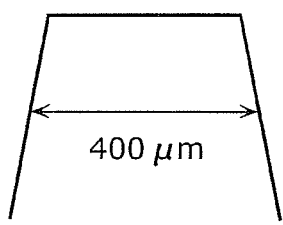
FIG. 8A illustrates a beam profile of a pulse laser used for the annealing in the method for fabricating the thin-film semiconductor device for display according to a comparative example.
Figure 8B:
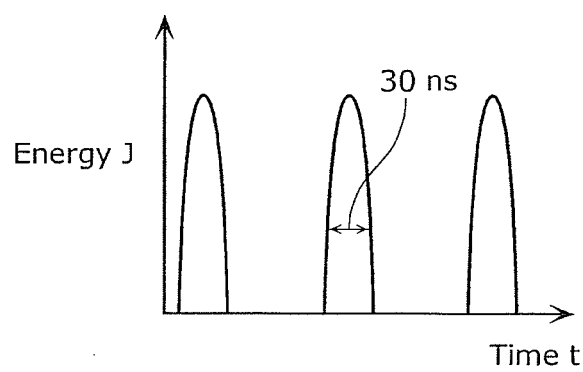
FIG. 8B illustrates an oscillation state of the laser when performing annealing using the pulse laser illustrated in FIG. 8A.

Here, the difference between the annealing using the CW laser and the annealing using the pulse laser shall be described with reference to FIG. 7A, FIG. 7B, FIG. 8A, and FIG. 8B. FIG. 7A illustrates a beam profile (short-axis) of the CW laser used for the laser annealing in the embodiment 1. FIG. 7B illustrates an oscillation state of the laser when performing annealing using the CW laser illustrated in FIG. 7A. FIG. 8A illustrates a beam profile of the pulse laser. FIG. 8B illustrates an oscillation state of the laser when performing annealing using the pulse laser illustrated in FIG. 8A.

When crystallizing the non-crystalline semiconductor layer, if the annealing is performed using the CW layer as illustrated in FIG. 7A and FIG. 7B, the heat input time to the non-crystalline semiconductor layer is longer than the annealing using the pulse layer as illustrated in FIG. 8A and FIG. 8B.

For example, as illustrated in FIG. 7A, the non-crystalline silicon layer is irradiated with a CW laser that is a green laser having a Gaussian light intensity distribution and a full width at half maximum (FWHM) of 60 µm and a beam scanning speed (stage speed) of 480 mm/s. In this case, the heat input time on the non-crystalline silicon layer is 0.13 µsec.

In contrast, as illustrated in FIG. 8A, the excimer laser having a beam width of 400 µm is used as the pulse laser, and the non-crystalline silicon layer is irradiated with the laser having a pulse width of 30 nsec, as illustrated in FIG. 8B. In this case, the heat input time on the non-crystalline silicon layer is 0.003 µsec.

As described above, the laser annealing using the CW laser has the heat input time longer than the laser annealing using the pulse laser by approximately two orders. With this, the heat conduction region is longer in laser annealing using the CW laser. Accordingly, the temperature at the interface between the undercoat layer 2 and the gate electrode 3 increases, causing the flake-offs.

The present disclosure prevents the flake-off generated when the CW laser is used. As described above, by forming the barrier layer 9 between the undercoat layer 2 and the gate electrode 3, it is possible to inhibit the oxidation of molybdenum in the gate electrode 3. Accordingly, it is possible to significantly reduce the probability that molybdenum turns into molybdenum oxide which would sublime in the temperature for annealing and turn into gas.

As described above, according to the thin-film semiconductor device for display 10 according to the embodiment 1, even when the nitride film is used as the undercoat layer 2, and molybdenum is used as the material for the gate electrode 3, and when the non-crystalline silicon layer is annealed using the CW laser, it is possible to inhibit the oxidation of molybdenum in the gate electrode 3. Accordingly, it is possible to significantly reduce the probability that molybdenum turns into molybdenum oxide which would sublime in the temperature for annealing and turn into gas. Therefore, it is possible to inhibit the circular flake-offs on the gate electrode. As such, the thin-film semiconductor device having desired characteristics can be implemented.

The inventors further considered a preferable range of the barrier layer 9. The detailed description shall be given below.

First, when the undercoat layer 2 made of SiN is formed on the glass substrate 1 and a high temperature process at approximately 800° C. is performed, the diffusion length of sodium in the glass substrate 1 calculated is approximately 99.6 nm. Note that, the diffusion coefficient $D_0$ is $2.09 \times 10^{-4}$ ($cm^2/s$), and the energy E is 1.82 (eV).

Accordingly, it is preferable that the thickness of the undercoat layer 2 is at least 100 nm in order to effectively inhibit the diffusion of sodium by the undercoat layer 2 made of SiN.

Figure 9:
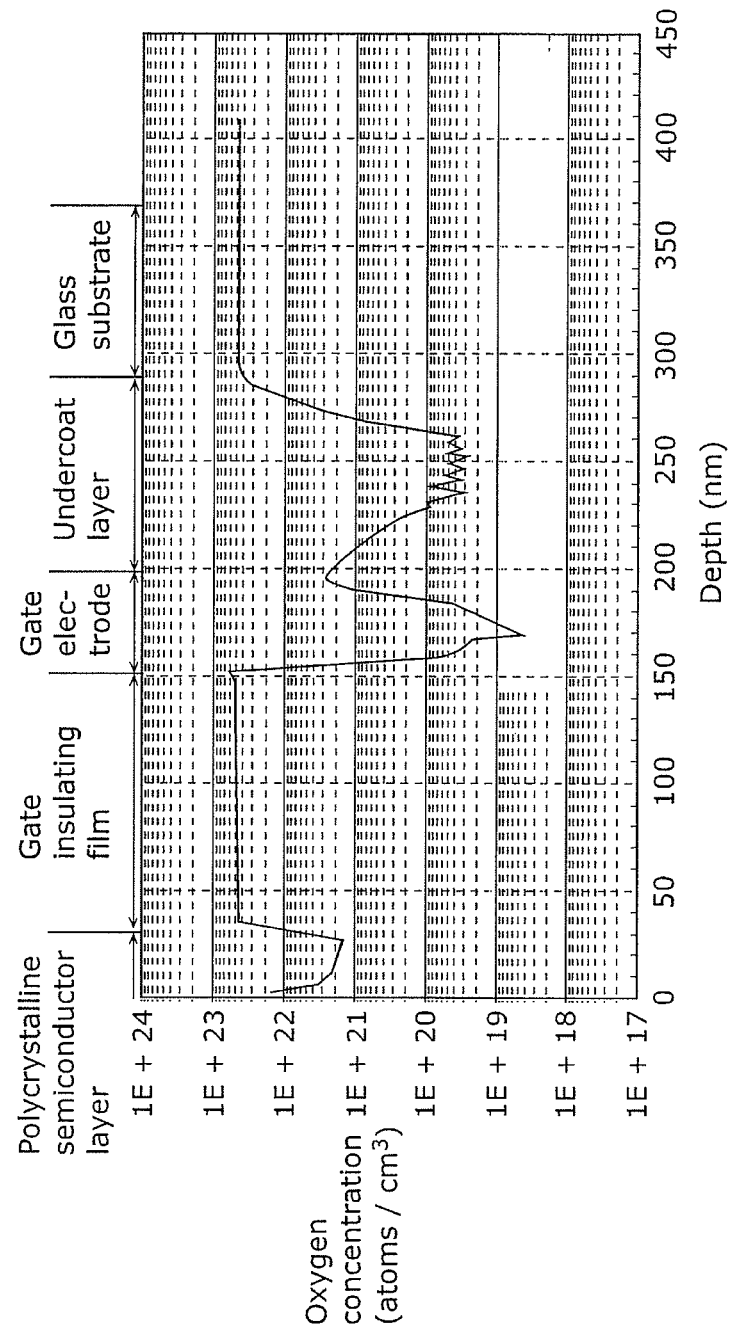
FIG. 9 a graph illustrating the concentration of oxygen atoms in the conventional thin-film semiconductor device illustrated in FIG. 5.

Here, the oxygen concentration in each layer of the conventional thin-film semiconductor device in which the barrier layer 9 is not formed as illustrated in (a) in FIG. 5 shall be described with reference to FIG. 9. FIG. 9 is a chart illustrating the concentration of oxygen atoms in the conventional thin-film semiconductor device illustrated in FIG. 5. FIG. 9 is a graph which includes the concentration of oxygen in a thickness (depth) direction from the polycrystalline silicon layer to the glass substrate in the thin-film semiconductor device measured by the secondary ion mass spectrometry (SIMS) and plotted. As the materials for the components, the polysilicon layer was made of crystallized amorphous silicon, the gate insulating film was silicon dioxide, the gate electrode was molybdenum tungsten, and the undercoat layer was silicon nitride.

As illustrated in FIG. 9, in the conventional thin-film semiconductor device in which the barrier layer 9 is not formed, the concentration of oxygen atoms present in the proximity of the interface between the undercoat layer 2 and the gate electrode 3 is $1\times10^{21}$ to $1\times10^{22}$ (atom/$cm^3$).

The results in FIG. 10 represent the thicknesses of the barrier layer 9 necessary for the reaction with all of the oxygen atoms present in the proximity of the interface between the undercoat layer 2 and the gate electrode 3. FIG. 10 is a diagram for illustrating the preferable thicknesses for the materials of the barrier layer in the thin-film semiconductor device for display according to the embodiment.

Note that, in order to calculate the thickness of the barrier layer 9 made of each material, the undercoat layer 2 is made of SiN having a thickness of 500 (nm), and the amount of oxygen atoms in the SiN film is $5\times10^{16}$ (atoms). In addition, the concentration of oxygen atoms present in the proximity of the interface between the undercoat layer 2 and the gate electrode 3 is $1\times10^{22}$ (atoms/$cm^3$), and a reaction rate is 10%.

As illustrated in FIG. 10, when the barrier layer 9 is composed using a metal material having a bonding force with oxygen atoms than that of molybdenum, by having the thickness of the barrier layer 9 to be at least 10 nm, all of the oxygen atoms react with the barrier layer 9 even when all of the oxygen atoms contained in the undercoat layer 2 made of SiN are diffused to the barrier layer 9.

Furthermore, since the barrier layer 9 is formed between the undercoat layer 2 and the gate electrode 3, the concentration of oxygen atoms contained in the undercoat layer 2 is $1\times10^{18}$/$cm^3$ to $1\times10^{21}$/$cm^3$. More specifically, the oxygen atoms contained in the undercoat layer 2 are diffused to the barrier layer 9, reducing the concentration of the oxygen atoms in the undercoat layer 2.

Furthermore, the thickness of the undercoat layer 2 is preferably at least 100 nm for inhibiting diffusion of sodium as described above. However, the thickness of the undercoat layer 2 is preferably at least 400 nm for improving the reliability of the film further.

A pressure test was performed on five samples each of which is a glass substrate and the undercoat layer 2 formed thereon. When the thickness of the undercoat layer 2 was 400 nm or 500 nm, no crack was found in the five samples. In contrast, when the thickness of the undercoat layer 2 was 300 nm, a crack was found in one of the five samples.

Accordingly, it is even more preferable to set the thickness of the undercoat layer 2 to be greater than or equal to 400 nm. Note that, in practical uses, the thickness of the undercoat layer 2 in the thin-film semiconductor device for display is preferably less than or equal to 600 nm.

Embodiment 2

Next, a thin-film semiconductor device for display and a method for fabricating the thin-film semiconductor device for display according to the embodiment 2 shall be described with reference to the drawings.

Figure 11:
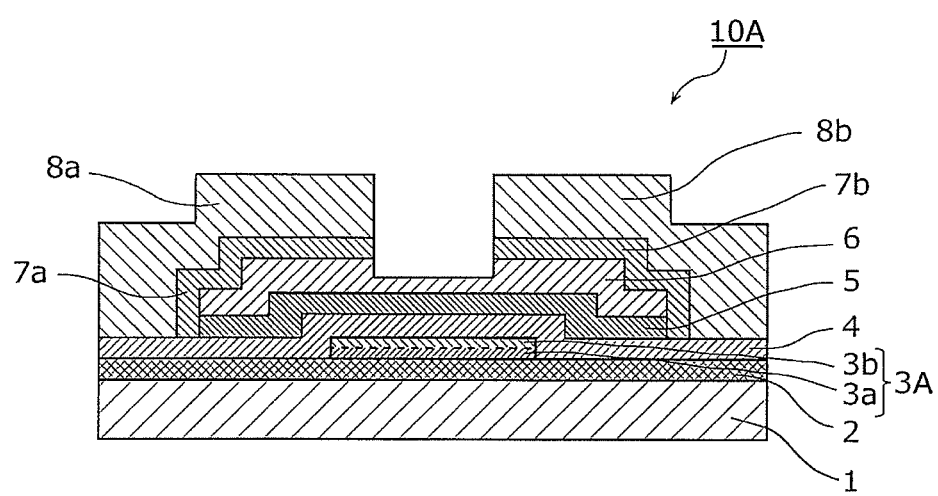
FIG. 11 is a cross-sectional view schematically illustrating a thin-film semiconductor device for display according to the embodiment 2.

A thin-film semiconductor device for display 10A according to the embodiment 2 shall be described with reference to FIG. 11. FIG. 11 is a cross-sectional view schematically illustrating the thin-film semiconductor device for display 10A according to the embodiment 2. Note that, in FIG. 11, the same reference numerals are assigned to the components identical to the components of the thin-film semiconductor device for display 10 according to the embodiment 1, and the detailed description for these components are omitted or simplified.

As illustrated in FIG. 11, the thin-film semiconductor device for display 10A according to the embodiment 2 is a bottom-gate thin-film transistor device including the glass substrate 1 and the following components sequentially formed on the glass substrate 1: the undercoat layer 2, a gate electrode 3A including a barrier layer 3a and a gate layer 3b, the gate insulating film 4, the polycrystalline semiconductor layer 5, the non-crystalline semiconductor layer 6, the pair of contact layers 7a and 7b, and the source electrode 8a and the drain electrode 8b which constitute a pair.

The feature of the thin-film semiconductor device for display 10A according to the embodiment 2 is that the gate electrode 3A is composed of the two-layer structure including the barrier layer 3a and the gate layer 3b.

The barrier layer 3a is an oxidation preventing layer for preventing the molybdenum contained in the gate layer 3b from oxidation, in the same manner as the barrier layer 9 according to the embodiment 1, and is formed on the undercoat layer 2 by sputtering. The barrier layer 3a is composed of a metal element having a bonding force with the oxygen atoms greater than that of molybdenum at a temperature greater than or equal to 700° C. or others.

More specifically, metal elements having high melting points of at least 900° C., that is, Fe, W, Nb, Cr, Mn, Ta, V, Si, Ti, or others may be used as the barrier layer 3a, in the same manner as the barrier layer 9 according to the embodiment 1. The barrier layer 3a may be composed of a single element of the metals or a compound of the metal such as TiW. The thickness of the barrier layer 3a is approximately 50 nm.

The gate layer 3b is a main gate electrode made of metal containing molybdenum (Mo) such as molybdenum tungsten (MoW), and is formed on the barrier layer 3a continuous to the barrier layer 3a. The thickness of the barrier layer 3b is approximately 50 nm.

Next, a method for fabricating the thin-film semiconductor device for display 10A according to the embodiment 2 shall be described with reference to FIG. 12 to FIG. 14.

Figure 12:
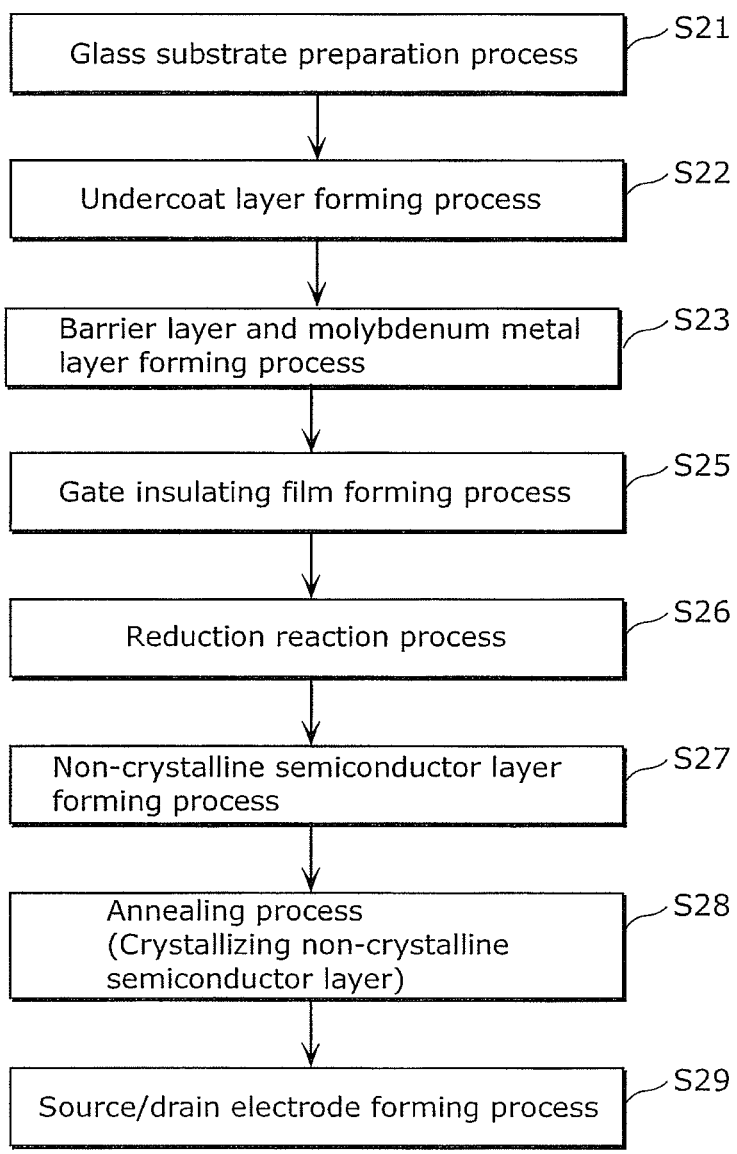
FIG. 12 is a flowchart illustrating a method for fabricating a thin-film semiconductor device for display according to the embodiment 2.

FIG. 12 is a flowchart illustrating the method for fabricating the thin-film semiconductor device for display 10A according to the embodiment 2.

As illustrated in FIG. 12, the method for fabricating the thin-film semiconductor device for display 10A according to the embodiment 2 includes at least a glass substrate preparation process (S21), an undercoat layer forming process (S22), a barrier layer and molybdenum metal layer forming process (S23), a gate electrode forming process (S25), a gate insulating film forming process (S26), a non-crystalline semiconductor layer forming process (S27), an annealing process (S28), and a source/drain electrode forming process (S29) in order.

The method for fabricating the thin-film semiconductor device for display 10A according to the embodiment 2 is different from the method for fabricating the thin-film semiconductor device for display according to the embodiment 1 in that the barrier layer 3a (the barrier layer forming film 3aM) and the gate layer 3b (the molybdenum metal layer 3bM) are continuously formed.

Note that, the details in each process in the fabrication method are identical to the method for fabricating thin-film semiconductor device for display according to the embodiment 1. Accordingly, the description of the processes is omitted. Note that, the method for fabricating the thin-film semiconductor device for display 10A according to the embodiment 2 includes processes in addition to the processes described above.

Note that, a specific method for fabricating the thin-film semiconductor device for display 10A according to the embodiment 2 shall be described in more detail with reference to FIG. 13 and FIG. 14 including the processes not described above. FIG. 13 and FIG. 14 are cross-sectional views schematically illustrating processes in the method for fabricating the thin-film semiconductor device for display 10A according to the embodiment 2. Note that, in FIG. 13 and FIG. 14, the same reference numerals are assigned to the components identical to the components illustrated in the fabrication method according to the embodiment 1 in FIG. 3 and FIG. 4, and the detailed description for the elements is omitted.

Figure 13:
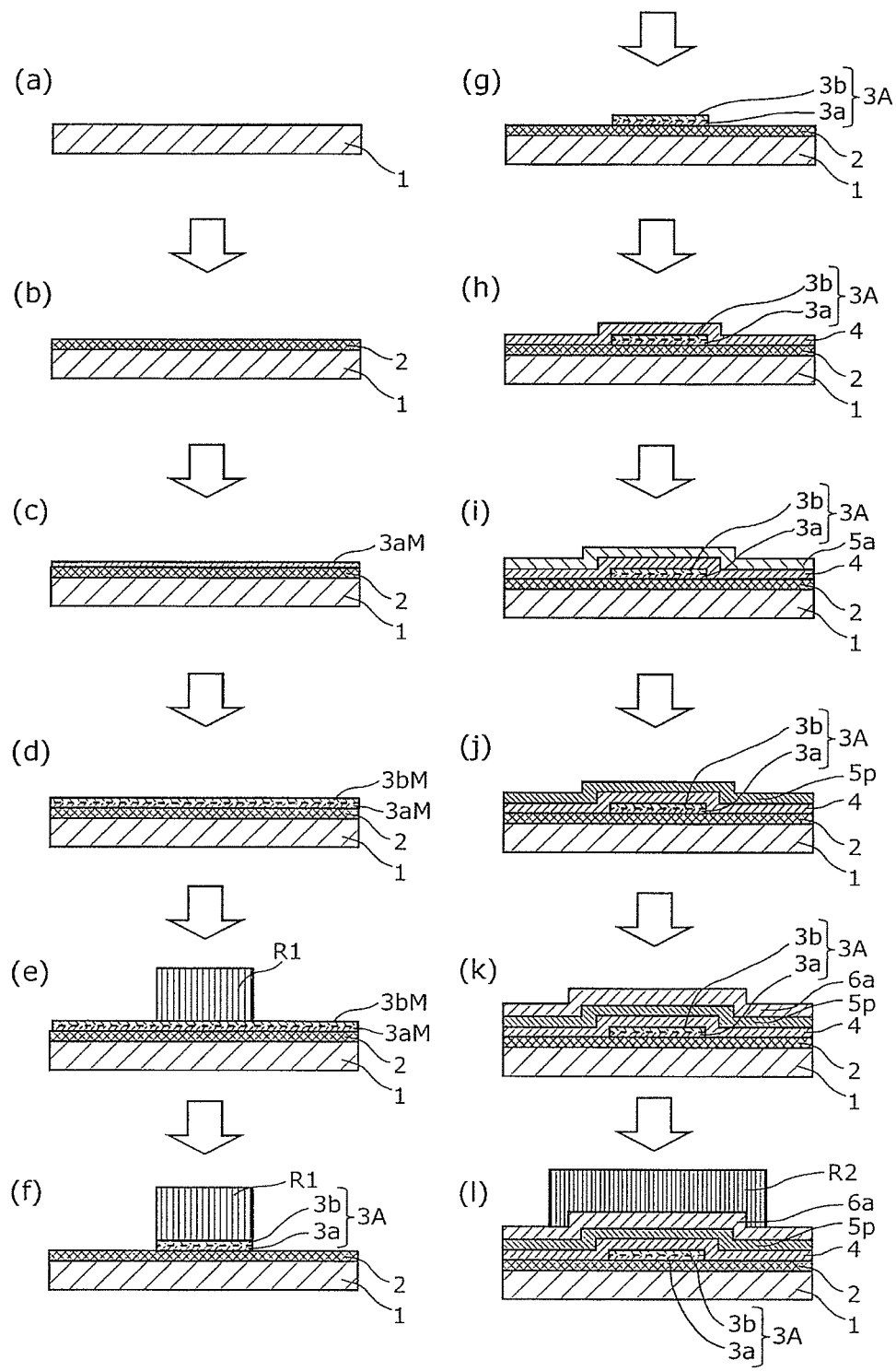
FIG. 13 is a cross-sectional view schematically illustrating processes in the method for fabricating the thin-film semiconductor device for display according to the embodiment 2.

First, in the same manner as (a) and (b) in FIG. 3 in the fabrication method according to the embodiment 1, the processes (a) and (b) in FIG. 13 are sequentially performed. More specifically, the glass substrate preparation process and the undercoat layer preparation process are sequentially performed. Note that, the processes in (a) and (b) in FIG. 13 are identical to the processes in (a) and (b) in FIG. 3, respectively.

Next, as illustrated in (c) in FIG. 13, the barrier layer forming film 3aM made of Ti and having a thickness of approximately 50 nm is formed on the undercoat layer 2 by sputtering. Subsequently, by switching the target in the same sputtering device, the molybdenum metal layer 3bM (the gate metal layer) containing molybdenum having a thickness of approximately 50 nm is continuously formed on the barrier layer forming film 3aM, as illustrated in (d) in FIG. 13. In this embodiment, molybdenum tungsten (MoW) is used as the molybdenum metal layer 3bM. As described above, in this embodiment, the barrier layer forming film 3aM and the molybdenum metal layer 3bM are formed by continuous sputtering.

Figure 14:
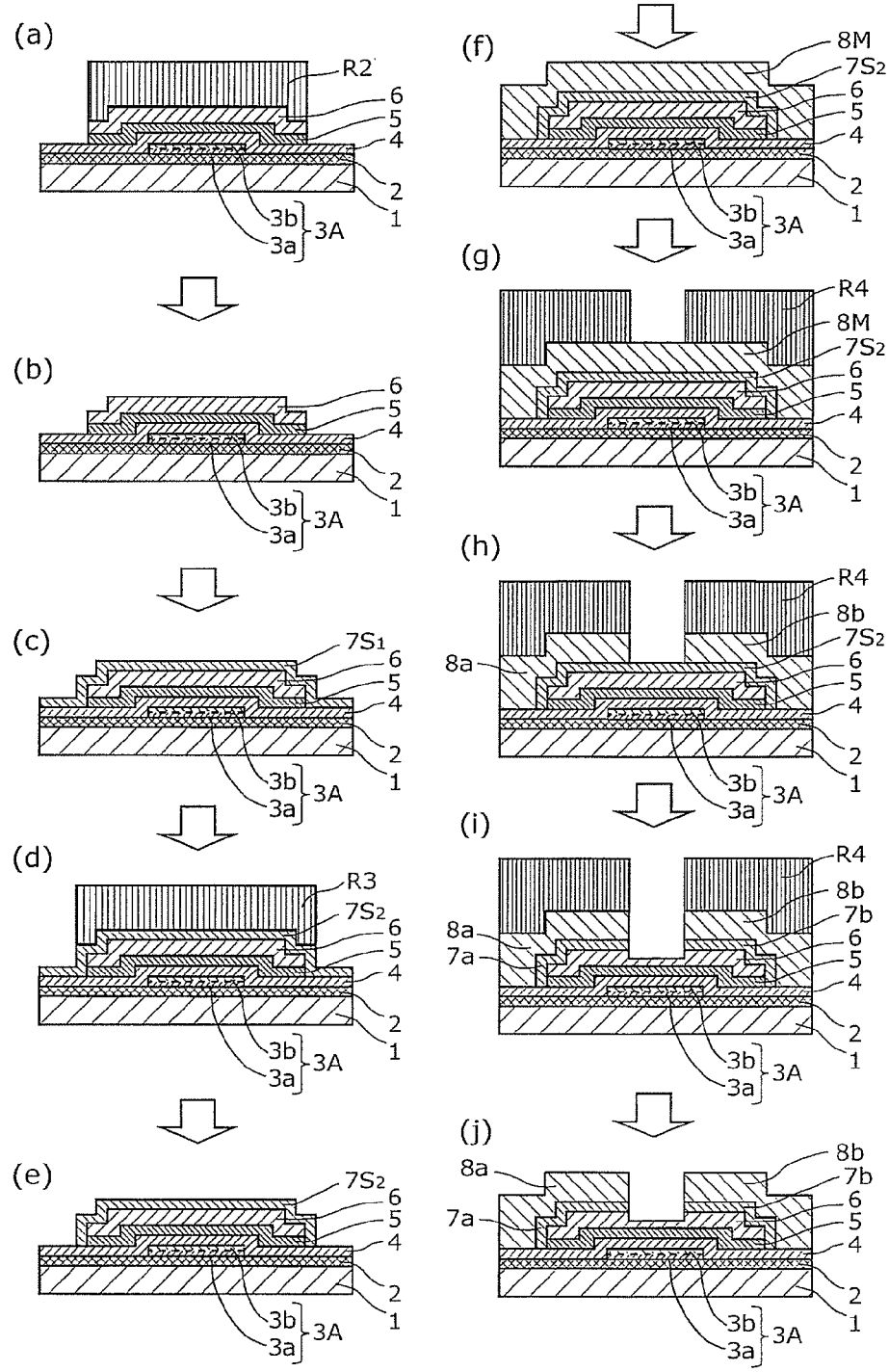
FIG. 14 is a cross-sectional view schematically illustrating processes in the method for fabricating the thin-film semiconductor device for display according to the embodiment 2.

Subsequently, in the same manner as the processes in (e) to (l) in FIG. 3 and (a) to (j) in FIG. 4 according to the embodiment 1, the processes in (e) to (l) in FIG. 13 and (a) to (j) in FIG. 14 are performed. Note that the processes in (e) to (l) in FIG. 13 and (a) to (j) in FIG. 14 are identical to the processes in (e) to (l) in FIG. 3 and (a) to (j) in FIG. 4, respectively.

More specifically, as illustrated in (d) in FIG. 13, after the barrier layer forming film 3aM and the molybdenum metal layer 3bM are formed by continuous sputtering, the gate electrode forming process, the gate insulating film forming process, the first non-crystalline semiconductor layer forming process, the annealing process, the second non-crystalline semiconductor layer forming process, the channel layer island forming process, the contact layer forming film forming process, the source/drain electrode forming process, and the contact layer forming process/channel etching process are performed in order.

Figure 15:
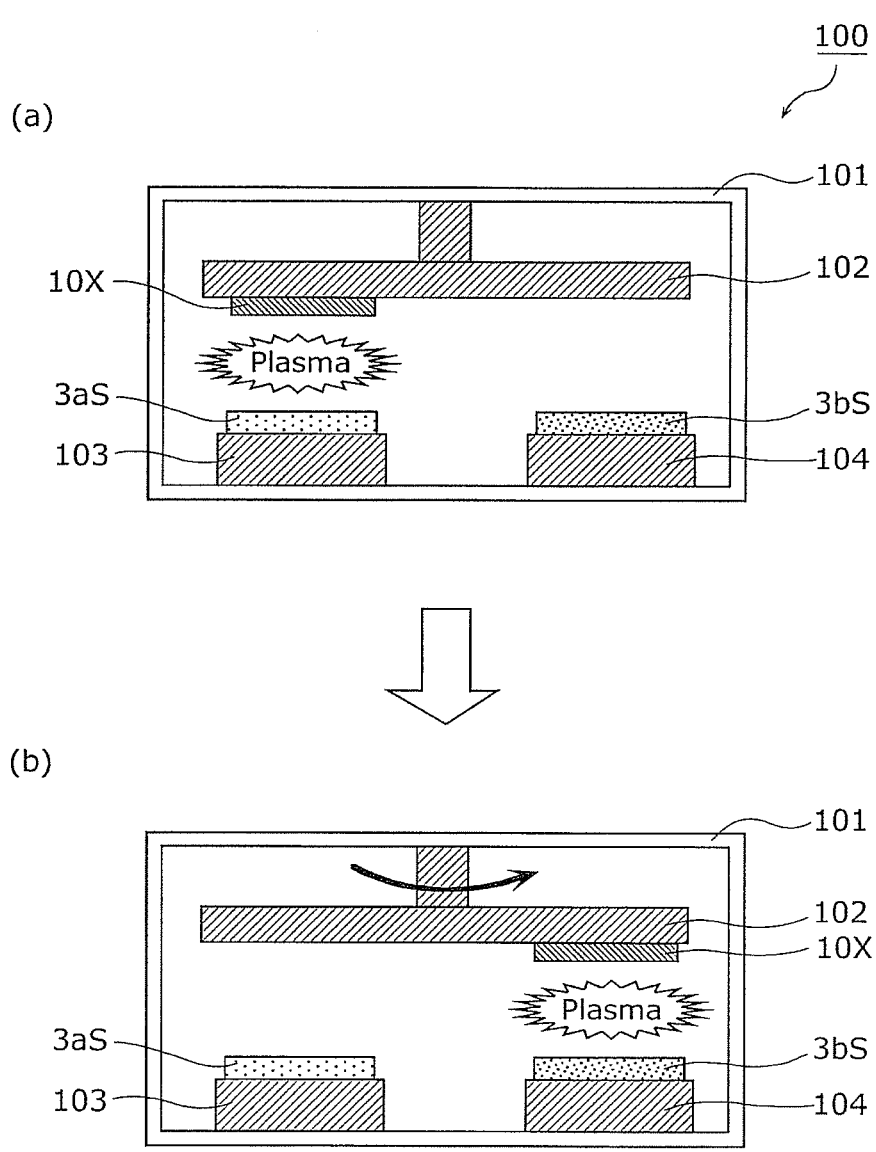
FIG. 15 is a cross-sectional view schematically illustrating a sputtering device used for fabricating a thin-film semiconductor device for display according to the embodiment 2.

As described above, in the method for fabricating the thin-film semiconductor device for display 10A according to the embodiment, the barrier layer forming film 3aM and the molybdenum metal layer 3bM are continuously formed by continuous sputtering in the same sputtering device. The continuous sputtering may be performed by a sputtering device illustrated in FIG. 15, for example. FIG. 15 is a cross-sectional view schematically illustrating a sputtering device 100 used for the method for fabricating the thin-film semiconductor device for display 10A according to the embodiment 2.

As illustrated in FIG. 15, the sputtering device 100 used in the fabrication method according to the embodiment is a binary sputtering device including two sputtering sources (targets), and includes a chamber 101, a substrate holder 102 provided in the chamber, a first sputtering source holder 103 on which a first sputtering source 3aS which is the first target is placed, and a second sputtering source holder 104 on which a second sputtering source 3bS which is the second target is placed.

The substrate holder 102 holds a sputtering target substrate 10X which is a sample, and turns around such that the sputtering target substrate 10X can face both the first sputtering source holder 103 and the second sputtering source holder 104. To put it differently, by turning the substrate holder 102 around, it is possible to change the sputtering source facing the sputtering target substrate 10X.

Note that, the first sputtering source 3aS placed on the first sputtering source holder 103 is the material for the barrier layer 3a in the embodiment 2. The second sputtering source 3bS placed on the second sputtering source holder 104 is the material for the gate layer 3b in the embodiment 2.

In the sputtering device 100 having the configuration described above, the glass substrate 1 on which the undercoat layer 2 is formed is placed under the substrate holder 102 such that the glass substrate 1 faces the first sputtering source 3aS.

Subsequently, as illustrated in (a) in FIG. 15, plasma is generated by applying voltage between the first sputtering source 3aS and the glass substrate 1, and the barrier layer 3a is formed on the undercoat layer 2.

Next, as illustrated in (b) in FIG. 15, the substrate holder 102 turns around such that the glass substrate 1 faces the sputtering holder 104, and plasma is generated by applying voltage between the second sputtering source 3bS and the glass substrate 1. As such, the gate layer 3b is formed on the barrier layer 3a.

Note that, the barrier layer 3a and the gate layer 3b may be formed with desired thickness by controlling the forming time using the difference in sputtering rates of the materials. Furthermore, the barrier layer 3a and the gate layer 3b may be formed with desired thicknesses by changing the voltage applied depending on the time when generating plasma using the two sputtering source.

As described above, the thin-film semiconductor device for display 10A according to the embodiment 2 can include the gate electrode 3A having the barrier layer 3a and the gate layer 3b by continuously forming the barrier layer forming film 3aM and the molybdenum metal layer 3bM. The gate electrode 3A formed as described above has composition gradient. Stated differently, the barrier layer 3a and the gate layer 3b do not have a clear interface. Rather, the lower layer of the gate electrode 3A is a layer rich in the material for the barrier layer 3a, and the upper layer of the gate electrode 3A is a layer rich in the material for the gate layer 3b, and the upper layer and the lower layer are integrally formed.

The thin-film semiconductor device for display 10A according to the embodiment 2 having the configuration described above can achieve the same effects as the thin-film semiconductor device for display 10 according to the embodiment 1. More specifically, since the barrier layer 3a made of a material having a bonding force with the oxygen atoms greater than that of molybdenum is formed between the undercoat layer 2 and the gate layer 3b. Accordingly, it is possible to suppress the oxidation of the molybdenum in the gate layer 3b. Accordingly, it is possible to significantly reduce the probability that molybdenum oxide sublimes in the temperature for annealing and turn into gas. Therefore, it is possible to inhibit the circular flake-offs on the gate electrode. As such, the thin-film semiconductor device having desired characteristics can be implemented.

Furthermore, in the thin-film semiconductor device for display 10A according to the embodiment, the barrier layer 3a and the gate layer 3b are continuously formed by continuous sputtering. Accordingly, the forming process for the gate electrode 3A as a whole is necessary only once, and by selecting the materials for the barrier layer 3a and the gate layer 3b, only one etching process is necessary for patterning the gate electrode 3A. Furthermore, with regard to the characteristics of the gate electrode 3A according to the embodiment as the gate electrode, characteristics equivalent to the regular gate electrode can be achieved.

Embodiment 3

Next, a method for fabricating a thin-film semiconductor device for display according to the embodiment 3 shall be described.

The method for fabricating the thin-film semiconductor device for display according to the embodiment 3 is different from the method for fabricating the thin-film semiconductor device for display according to the embodiments 1 and 2 in which the annealing for crystallizing the non-crystalline silicon layer is the CW laser in that the annealing process is the rapid thermal annealing (RTA).

More specifically, the method for fabricating the thin-film semiconductor device for display according to the embodiment 3 includes at least the glass substrate preparation process, the undercoat layer forming process, the barrier layer forming process, the molybdenum metal layer forming process, the gate electrode forming process, the gate insulting film forming process, the non-crystalline semiconductor layer forming process, the annealing process, and the source/drain electrode forming process in order, in the same manner as the embodiment 1.

In the annealing according to the embodiment 3, the non-crystalline silicon layer is annealed at a temperature in a range from 700° C. to 900° C. for at least 1 second using the RTA so as to crystallize the non-crystalline silicon layer to form the polysilicon layer. Note that, the process other than the annealing process may be performed in the same manner as the embodiment 1.

As described above, in the embodiment 3, the non-crystalline silicon layer is crystallized using the RTA, and the annealing is performed on the non-crystalline silicon layer at a temperature in a range from 700° C. to 900° C. The temperature range from 700° C. to 900° C. in silicon is a temperature range referred to as solid phase crystallization (SPC), and is included in a temperature range from the crystal growth temperature (600° C.) to a melting point (1100° C.) of amorphous silicon. In the temperature range in SPC, amorphous silicon is crystallized by the solid-phase growth. In this case, the crystalline structure of silicon has an average crystal grain size of approximately 25 nm to 35 nm.

In addition, in the embodiment 3, the annealing is performed for a time of at least 1 second. Stated differently, when the annealing using the CW laser is performed as described in the embodiments 1 and 2, the heat input time is short, that is, for 0.1 µsec. However, the annealing by the RTA requires the annealing time for at least 1 second.

Figure 16:
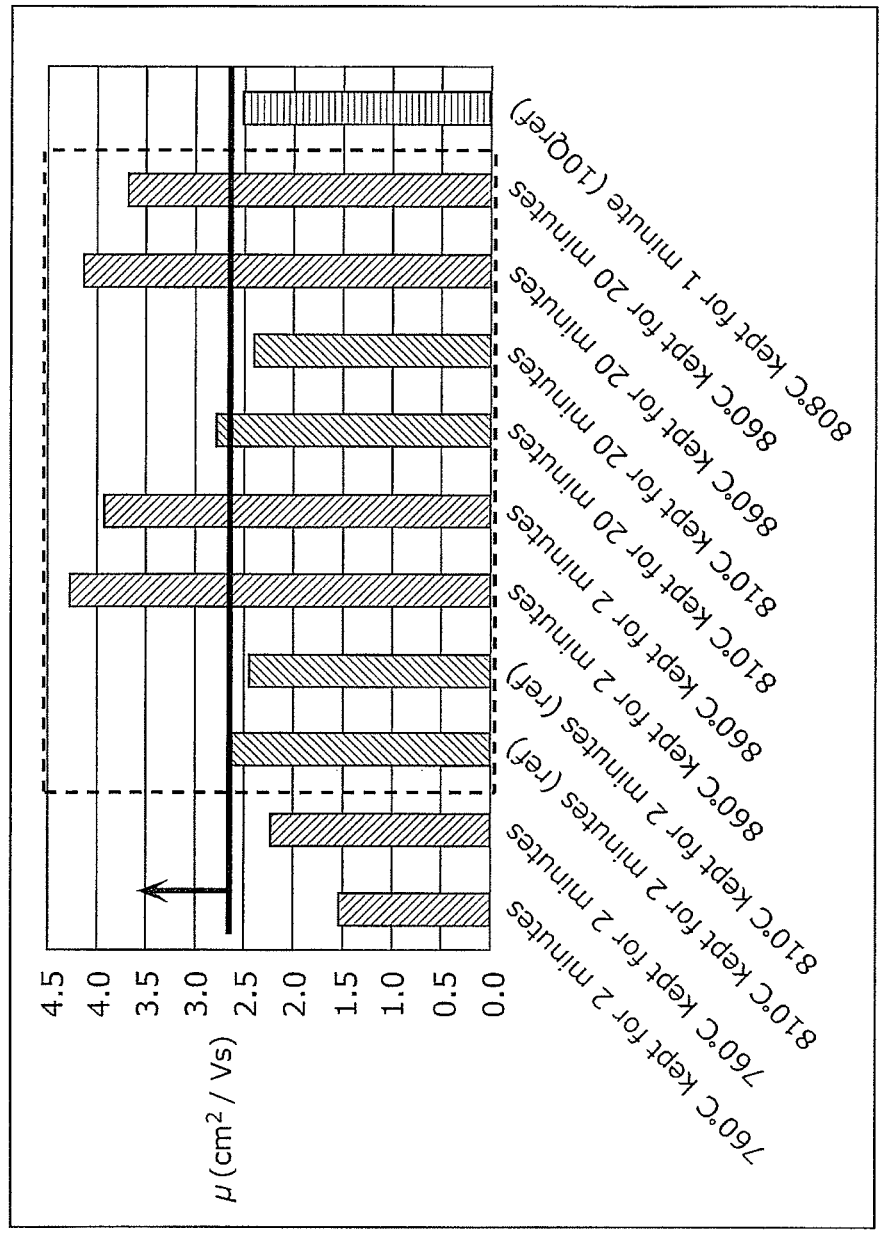
FIG. 16 is a graph illustrating a relationship between (i) carrier mobility and (ii) the annealing temperatures and the annealing times in the thin-film semiconductor devices for display each including a polycrystalline silicon layer formed by the crystallization using the RTA as the channel layer.

Here, the dependency on the temperature and time in the crystallization annealing by the RTA shall be described with reference to FIG. 16. FIG. 16 is a graph illustrating a relationship between (i) carrier mobility and (ii) the annealing temperatures and the annealing times in the thin-film semiconductor devices for display each including a polycrystalline silicon layer formed by the crystallization using the RTA as the channel layer. Note that, the carrier mobility (µ) affects the state of crystals in the polysilicon layer, and the larger the crystal grain size, the carrier mobility increases, and when the carrier mobility is in the same level, the state of the crystals is also in the same level. Furthermore, in the experiment, the crystallization is performed in a temperature range of SPC (solid-state growth) on the non-crystalline silicon layer.

As illustrated in FIG. 16, when the condition for the temperature is the same, the comparison between the case in which the annealing time is kept for two minutes and the case in which the annealing time is kept for 20 minutes shows that the carrier mobility of the thin-film semiconductor device for display is in the same level. Stated differently, the carrier mobility in the thin-film semiconductor device for display does not depend on the annealing time. More specifically, the crystallization state of the polysilicon layer does not depend on the annealing time either.

A comparison between the cases having the same annealing time shows that the higher the temperature at the time of annealing is, the higher the carrier mobility. Stated differently, the carrier mobility in the thin-film semiconductor device for display depends on the temperature at the time of annealing.

As described above, when annealing the non-crystalline silicon layer for crystallization is performed by the RTA, the carrier mobility in the thin-film semiconductor device for display does not change depending on the annealing time (that is, the crystallization state of the polysilicon layer does not change), but the annealing for at least 1 second is necessary for desired crystallization.

Note that, when the RTA is performed by a lamp annealing device having a rate of temperature rise of 200° C./s, the annealing time for 3 seconds to 5 seconds allows heating the non-crystalline silicon layer to 600° C. to 800° C., disregarding the keeping time. In addition, the keeping time for approximately 5 minutes enables stable RTA.

As described above, the method for fabricating the thin-film semiconductor device for display according to the embodiment 3 achieves the same effects as the method for fabricating the thin-film semiconductor device for display according to the embodiment 1. More specifically, even when the non-crystalline silicon layer is annealed for crystallization by the RTA, it is possible to form the desired polysilicon layer by setting the annealing time to be at least 1 second. In this case, the barrier layer made of a material having a bonding force with the oxygen atoms greater than that of molybdenum is formed between the undercoat layer and the gate electrode, which suppresses the oxidation of molybdenum in the gate electrode. Accordingly, it is possible to significantly reduce the probability that molybdenum oxide sublimes in the temperature for annealing and turn into gas. Therefore, it is possible to inhibit the flake-offs on the gate electrode.

Note that, in the method for fabricating the thin-film semiconductor device for display according to the embodiment 3, the embodiment 2 may be applied. Furthermore, the configuration of the thin-film semiconductor device for display according to the embodiment 3 is identical to the thin-film semiconductor device for display according to the embodiments 1 and 2.

Embodiment 4

Next, the display device according to the embodiment 4 in which the thin-film semiconductor device for display according to the embodiments is used in a display shall be described with reference to FIG. 17. Note that, in an aspect of the display device according to the embodiment 4, an example in which the display device is applied to an organic EL display shall be described.

Figure 17:
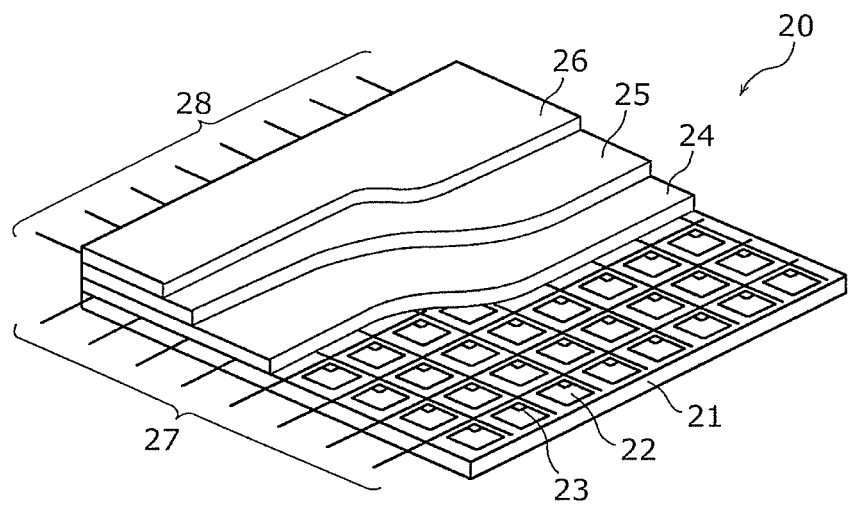
FIG. 17 is a partial cutout perspective view of an organic EL display according to the embodiment 4.

FIG. 17 is a partial cutout perspective view of an organic EL display according to the embodiment 4. The thin-film semiconductor device for display according to each of the embodiments may be used as the switching device for an active matrix substrate in the organic EL display.

As illustrated in FIG. 17, an organic EL display 20 includes an active matrix substrate 21, pixels 22 arranged in a matrix on the active matrix substrate 21, pixel circuits 23 connected to the pixels 22 and arranged in an array on the active matrix substrate 21, an anode 24, an organic EL layer 25, and a cathode 26 (transparent electrode) sequentially stacked on the pixels 22 and the pixel circuits 23, and source lines 27 and gate lines 28 connecting the pixel circuits 23 and a control circuit (not illustrated). The organic EL layer 25 is formed by stacking layers such as an electron transport layer, a light-emitting layer, a hole transport layer, and others.

In the organic EL display 20, the thin-film semiconductor device for display in one of the embodiments is provided for each of the pixel circuits 23.

Figure 18:
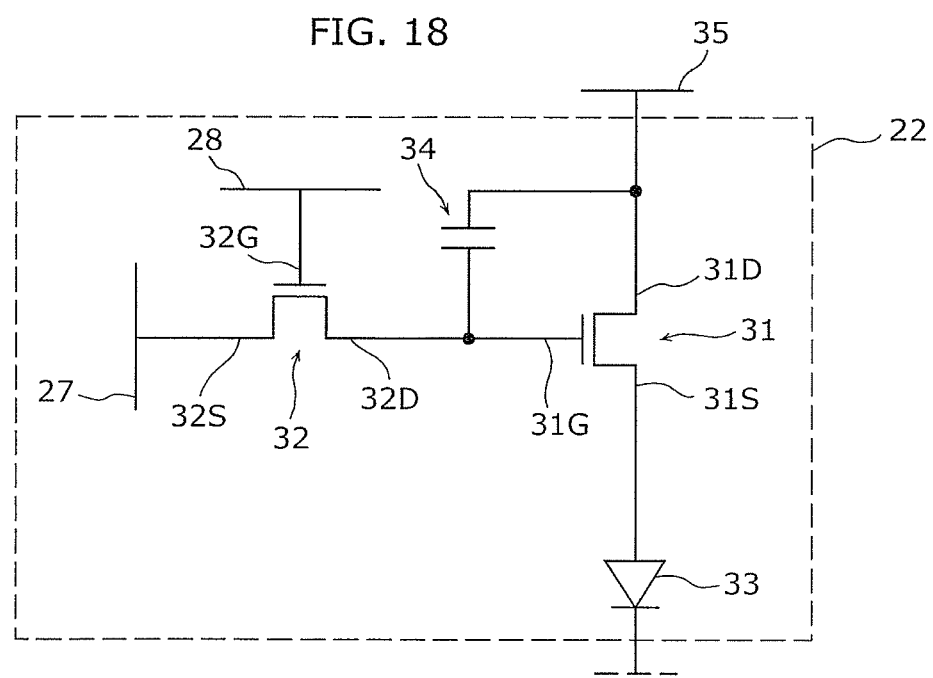
FIG. 18 is a circuit configuration diagram of a pixel using a thin-film semiconductor device for display according to the embodiments.

Next, the circuit configuration of each of the pixels 22 in the organic EL display 20 shall be described with reference to FIG. 18. FIG. 18 is a circuit configuration diagram of the pixel using the thin-film semiconductor device for display according to the embodiments of the present disclosure.

As illustrated in FIG. 18, the pixel 22 includes a thin-film semiconductor device 31 for driving, a thin-film semiconductor device 32 for selecting, an organic EL device 33, and a capacitor 34. The thin-film semiconductor device 31 for driving is a driving transistor for driving the organic EL device 33, and the thin-film semiconductor device 32 for selecting is a switching transistor for selecting a pixel to which a video signal is to be supplied.

A source electrode 32S in the thin-film semiconductor device 32 for selecting is connected to the source line 27, and a gate electrode 32G is connected to the gate line 28, and a drain electrode 32D is connected to a capacitor 34 and a gate electrode 31G of the thin-film semiconductor device 31 for driving.

Furthermore, the drain electrode 31D in the thin-film semiconductor device 31 for driving is connected to the power supply line 35, and a source electrode 31S is connected to the anode of the organic EL device 33.

With this configuration, a gate signal is input to the gate line 28, turning on the thin-film semiconductor device 32 for selection. Subsequently, signal voltage supplied through the source line 27 is written on the capacitor 34. The holding voltage written on the capacitor 34 is held for one frame period. By the holding voltage, the conductance of the thin-film semiconductor device 31 for driving changes in an analog manner, and driving current corresponding to the tone of emitted light flows from the anode of the organic EL device 33 to the cathode of the organic EL device 33. With this current, the organic EL device 33 emits light, and an image is displayed.

Note that, the thin-film semiconductor devices for display according to the embodiments may be applied to both the thin-film semiconductor device 31 for driving and the thin-film semiconductor device 32 for selecting.

The display according to an aspect of the present disclosure has been described above. However, the present disclosure is not limited to the display. For example, in the embodiment, the organic EL display using an organic EL device has been described. However, the present disclosure is applicable to a display including other display devices using an active matrix substrate such as a liquid crystal display device.

Furthermore, the display according to the embodiment 4 can be used as a flat-panel display, and is applicable to any display device such as a television set, a personal computer, a mobile phone, and others.

The method for fabricating the thin-film semiconductor device for display according to the present disclosure has been described with reference to the embodiments. The method for fabricating thin-film semiconductor device according to the present disclosure is not limited to the embodiments.

For example, in the embodiments above, the barrier layer is patterned to have the same shape as the gate electrode. However, it is not limited to this example. For example, the barrier layer may be composed of an insulating film such as SiO, and in this case, it is not necessary to pattern the barrier layer.

In the embodiments described above, the undercoat layer 2 is a single-layer silicon nitride film. However, it is not limited to this example. The undercoat layer 2 may be configured to include a nitride film, and a silicon oxynitride film maybe used as the nitride film instead of the silicon nitride film.

Furthermore, the gate insulating film may be a stacked structure including silicon nitride (lower layer) and silicon dioxide (upper layer). However, since the polysilicon layer is used as the channel layer, a single-layer silicon dioxide is used as the gate insulating film, for example. This is because, although the stacked structure of silicon nitride and silicon dioxide inhibits the flake-off on the gate electrode, the threshold voltage shifts to a negative side if the stacked structure is used.

Those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The thin-film semiconductor device for display according to the present disclosure can be widely used for display devices such as a television set, a personal computer, a mobile phone and others, or for various electric appliances as a switching device or others.

The invention claimed is:
1. A method for fabricating a thin-film semiconductor device the method comprising:
    preparing a glass substrate;
    forming, above the glass substrate, an undercoat layer for inhibiting diffusion of an impurity in the glass substrate, the undercoat layer including a nitride film;
    forming a barrier layer above the undercoat layer;
    forming a metal layer comprising molybdenum above the barrier layer;
    forming a gate electrode from the metal layer by an etching process;
    forming a gate insulating film above the gate electrode;

forming a non-crystalline silicon layer above the gate insulating film;
forming a polysilicon layer by annealing the non-crystalline silicon layer at a temperature in a range from 700° C. to 900° C. for at least 1 second using a rapid thermal annealing (RTA), the non-crystalline silicon layer being crystallized by the annealing; and
forming a source electrode and a drain electrode above the polysilicon layer,
wherein the barrier layer comprises an element having a bonding force with an oxygen atom greater than that of the molybdenum or a compound of the element, and
at least part of the barrier layer changes into a layer comprising oxygen atoms as a major component by the annealing when forming the polysilicon layer.

2. A method for fabricating a thin-film semiconductor device, the method comprising:
preparing a glass substrate;
forming, above the glass substrate, an undercoat layer for inhibiting diffusion of an impurity in the glass substrate, the undercoat layer including a nitride film;
forming a barrier layer above the undercoat layer;
forming a metal layer comprising molybdenum above the barrier layer;
forming a gate electrode from the metal layer by an etching process;
forming a gate insulating film above the gate electrode;
forming a non-crystalline silicon layer above the gate insulating film;
forming a polysilicon layer by annealing the non-crystalline silicon layer at a temperature higher than or equal to a melting temperature of the non-crystalline silicon layer for at least 0.1 μsec using a continuous-wave (CW) laser, the non-crystalline silicon layer being crystallized by the annealing; and
forming a source electrode and a drain electrode above the polysilicon layer,
wherein the barrier layer comprises (i) an element having a force for bonding with an oxygen atom greater than that of the molybdenum or (ii) a compound of the element, and
at least part of the barrier layer changes into a layer comprising oxygen atoms as a major component by the annealing when forming the polysilicon layer.

3. The method for fabricating the thin-film semiconductor device according to claim 2,
wherein the barrier layer has a thickness of at least 10 nm.

4. The method for fabricating the thin-film semiconductor device according to claim 2,
wherein the undercoat layer has a thickness of at least 100 nm.

5. The method for fabricating the thin-film semiconductor device according to claim 2,
wherein the undercoat layer has a thickness of at least 400 nm.

6. The method for fabricating the thin-film semiconductor device according to claim 2,
wherein a concentration of oxygen atoms in the undercoat layer is in a range from $1\times10^{18}/cm^3$ to $1\times10^{21}/cm^3$.

7. The method for fabricating the thin-film semiconductor device according to claim 2,
wherein the non-crystalline silicon layer melts at a temperature more than or equal to 1100° C.

8. The method for fabricating the thin-film semiconductor device according to claim 2,
when forming the polysilicon layer, oxygen atoms present on a surface of the undercoat layer are likely to be bonded with the element or the compound of the element comprising the barrier layer, instead of the molybdenum comprising the gate electrode, and oxidation of the barrier layer is promoted.

9. The method for fabricating the thin-film semiconductor device according to claim 2,
wherein the impurity in the glass substrate is sodium or phosphorus.

10. The method for fabricating the thin-film semiconductor device according to claim 2,
wherein the glass substrate contains oxygen atoms as a major component,
the undercoat layer has a force for bonding with oxygen atoms that is weaker than that of the glass substrate, and
the molybdenum has a force for bonding with oxygen atoms that is weaker than that of the glass substrate and stronger than that of the undercoat layer.

11. The method for fabricating the thin-film semiconductor device according to claim 2, the method further comprising
forming a second non-crystalline silicon layer above the polysilicon layer between forming the polysilicon layer and forming the source electrode and drain electrode,
wherein the source electrode and the drain electrode are formed above the second non-crystalline silicon layer.

12. The method for fabricating the thin-film semiconductor device according to claim 2,
wherein the polysilicon layer includes a microcrystalline silicon layer having an average grain size in a range from 20 nm to 200 nm.

13. The method for fabricating the thin-film semiconductor device according to claim 2,
wherein the element having the force for bonding with the oxygen atom greater than that of the molybdenum, is a metal.

14. The method for fabricating the thin-film semiconductor device according to claim 13,
wherein the metal is any one of Fe, W, Nb, Cr, Mn, Ta, V, and Ti.

15. The method for fabricating the thin-film semiconductor device according to claim 2,
wherein, when forming the gate electrode, the etching process is collectively performed on the barrier layer and the metal layer, and the gate electrode includes the barrier layer and the metal layer.

16. The method for fabricating the thin-film semiconductor device according to claim 15,
wherein the barrier layer and the metal layer are formed by sputtering.

17. A thin-film semiconductor device, comprising:
a glass substrate;
an undercoat layer, above the glass substrate, for inhibiting diffusion of an impurity in the glass substrate, the undercoat layer including a nitride film;
a barrier layer above the undercoat layer;
a gate electrode comprising molybdenum above the barrier layer;
a gate insulating film above the gate electrode;
a polysilicon layer above the gate insulating film; and
a source electrode and a drain electrode above the polysilicon layer,
wherein the barrier layer comprises (i) an element having a bonding force with an oxygen atom greater than that of the molybdenum or (ii) a compound of the element,
the polysilicon layer is formed by annealing a non-crystalline silicon layer at a temperature higher than or equal to a melting temperature of the non-crystalline silicon layer for at least 0.1 μsec using a continuous-wave (CW) laser, and at least part of the barrier layer at an interface between the barrier layer and the undercoat layer is changed into a layer comprising oxygen as a major component.

18. The thin-film semiconductor device according to claim 17, wherein the barrier layer has a thickness of at least 10 nm.

19. The thin-film semiconductor device according to claim 17, wherein the undercoat layer has a thickness of at least 100 nm.

20. The thin-film semiconductor device according to claim 17, wherein the undercoat layer has a thickness of at least 400 nm.

21. The thin-film semiconductor device according to claim 17, wherein a concentration of oxygen atoms in the undercoat layer is in a range from $1\times10^{18}/cm^3$ to $1\times10^{21}/cm^3$.

22. The thin-film semiconductor device according to claim 17, wherein the impurity in the glass substrate is sodium or phosphorus.

23. The thin-film semiconductor device according to claim 17, wherein the glass substrate contains oxygen atoms as a major component, the undercoat layer has a force for bonding with oxygen atoms that is weaker than that of the glass substrate, and the molybdenum has a force for bonding with oxygen atoms that is weaker than that of the glass substrate and stronger than that of the undercoat layer.

24. The thin-film semiconductor device according to claim 17, further comprising a non-crystalline silicon layer above the polysilicon layer, wherein the source electrode and the drain electrode are formed above the non-crystalline silicon layer.

25. The thin-film semiconductor device according to claim 17, wherein the polysilicon layer includes a microcrystalline silicon layer having an average grain size in a range from 20 nm to 200 nm.

26. The thin-film semiconductor device according to claim 17, wherein the element having the force for bonding with the oxygen atom greater than that of the molybdenum is a metal.

27. The thin-film semiconductor device according to claim 26, wherein the metal is any one of Fe, W, Nb, Cr, Mn, Ta, V, and Ti.

28. The thin-film semiconductor device according to claim 17, wherein the gate electrode has a same shape as the barrier layer.

* * * * *